(12) United States Patent
Hayashi

(10) Patent No.: US 7,037,810 B2
(45) Date of Patent: May 2, 2006

(54) METHOD OF REPLACING ATMOSPHERE OF CHAMBER APPARATUS, CHAMBER APPARATUS, ELECTRO-OPTIC APPARATUS, AND ORGANIC EL DEVICE

(75) Inventor: Takayuki Hayashi, Shimosuwa-machi (JP)

(73) Assignee: Seiko Epson Corporation, Tokyo (JP)

( * ) Notice: Subject to any disclaimer, the term of this patent is extended or adjusted under 35 U.S.C. 154(b) by 376 days.

(21) Appl. No.: 10/352,217

(22) Filed: Jan. 28, 2003

(65) Prior Publication Data

US 2004/0003778 A1 Jan. 8, 2004

(30) Foreign Application Priority Data

Feb. 12, 2002 (JP) .............................. 2002-034031

(51) Int. Cl.
*H01L 21/00* (2006.01)
*H01L 21/36* (2006.01)

(52) U.S. Cl. ........................ 438/479; 438/711; 118/715

(58) Field of Classification Search ................ 438/497, 438/702, 710, 711, 712; 118/715, 723
See application file for complete search history.

(56) References Cited

U.S. PATENT DOCUMENTS

| | | | | | |
|---|---|---|---|---|---|
| 3,810,327 | A | * | 5/1974 | Giansante | 47/1.1 |
| 3,988,900 | A | * | 11/1976 | Kamata et al. | 62/92 |
| 6,434,944 | B1 | * | 8/2002 | White | 60/670 |
| 6,535,270 | B1 | * | 3/2003 | Murayama | 355/30 |
| 6,704,088 | B1 | * | 3/2004 | Tanimoto | 355/30 |

FOREIGN PATENT DOCUMENTS

KR    1999/0068950    9/1999

\* cited by examiner

*Primary Examiner*—Phuc T. Dang
(74) *Attorney, Agent, or Firm*—Oliff & Berridge, PLC

(57) ABSTRACT

An atmosphere of an inert gas inside a chamber room in a chamber apparatus is replaced with an outside air by opening a discharge passage in the chamber room and by closing a gas supply passage for supplying the inert gas. The outside air is thus forcibly sent to the chamber room to thereby replace the inert gas remaining inside the chamber room with the outside air.

16 Claims, 26 Drawing Sheets

F I G. 4
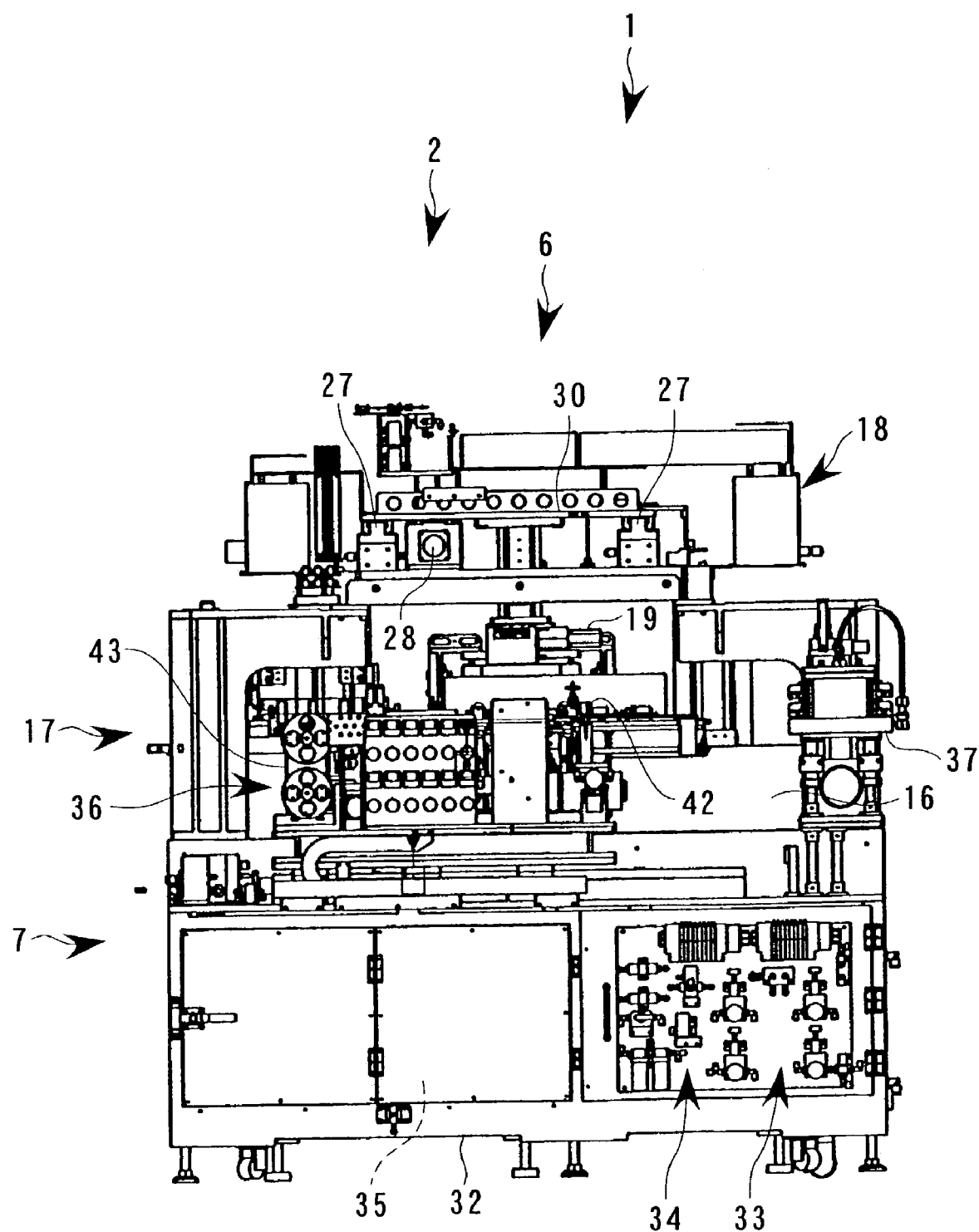

F I G. 5
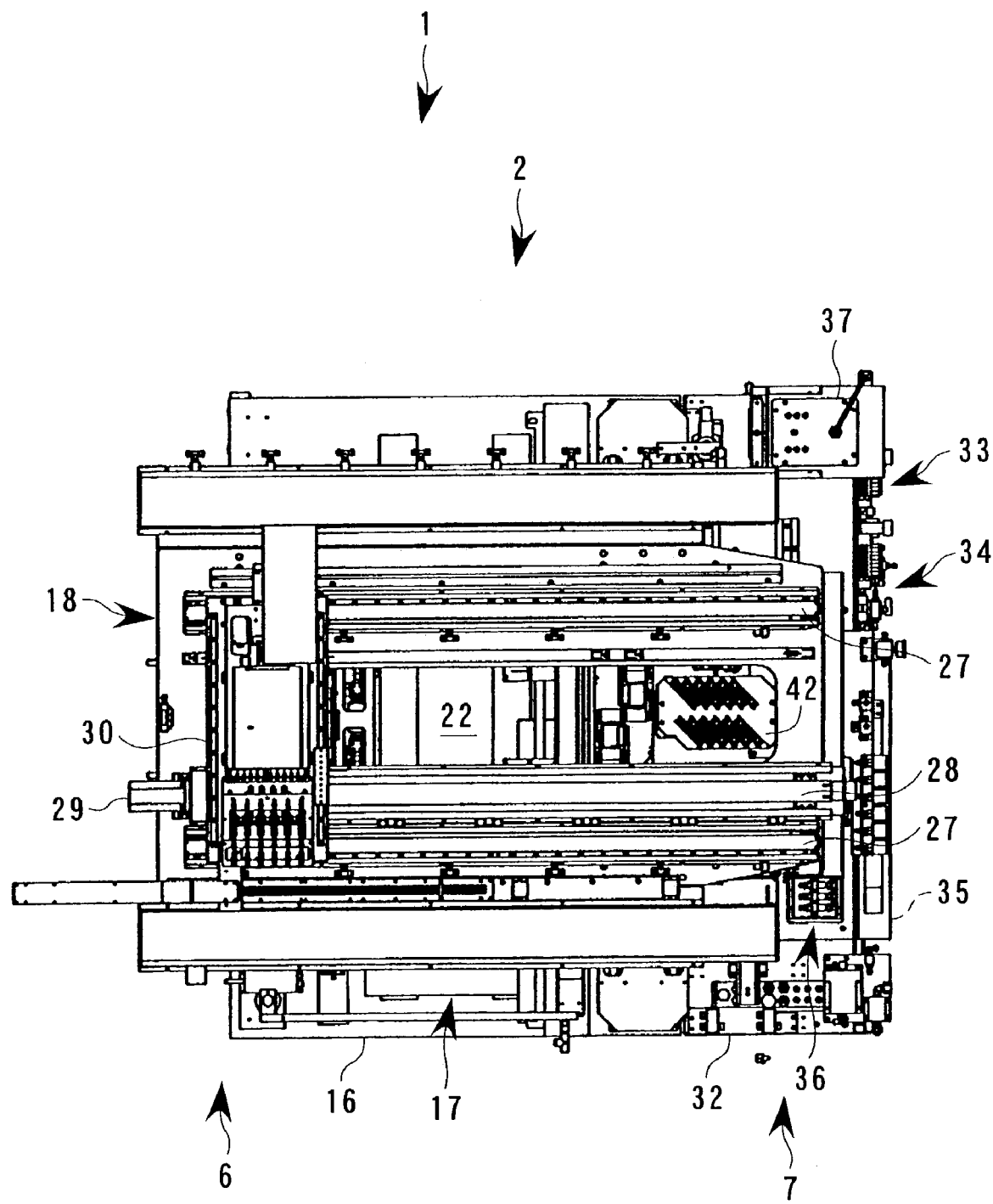

METHOD OF REPLACING ATMOSPHERE OF CHAMBER APPARATUS, CHAMBER APPARATUS, ELECTRO-OPTIC APPARATUS, AND ORGANIC EL DEVICE

BACKGROUND OF THE INVENTION

1. Field of the Invention

This invention relates to a method of replacing an atmosphere of a chamber apparatus. The chamber apparatus is for housing or containing therein a workpiece processing apparatus in a manner capable of performing maintenance work, and the workpiece processing apparatus is required to carry out the processing of a workpiece such as a substrate in an inert gas atmosphere. This invention also relates: to the chamber apparatus; to an electro-optic apparatus provided with the chamber apparatus; and also to an organic electroluminescent (EL) device.

2. Description of Related Art

In a conventional chamber apparatus for use in a semiconductor manufacturing apparatus, or the like, in which the workpiece processing is carried out in an atmosphere of an inert gas, the atmosphere of the inert gas inside a chamber is replaced with (or changed for) outside air (open air or atmospheric air) to secure safety for the worker (e.g., to prevent him from suffering from oxygen deficiency) at the time of feeding and taking out the workpiece, or a similar job. The replacing of the inert gas with the outside air is ordinarily carried out by vacuum suction of the inert gas inside the chamber.

In this kind of conventional chamber apparatus, since the replacing of the inert gas with the outside air is carried out by vacuum suction, there is a problem in that a relatively long time is required and that the inert gas is likely to remain therein. Especially, in a chamber apparatus having a large volume, the time required to replace the inert gas with the outside air is estimated to have a large effect on the tact time in the manufacture of the semiconductor device.

This invention provides a method of replacing an atmosphere in a chamber apparatus with outside air, the method being capable of efficiently replacing an atmosphere of an inert gas inside the chamber room of the chamber apparatus with outside air at a short time. This invention also provides a chamber apparatus, an electro-optic apparatus provided with the chamber apparatus, and an organic electroluminescent (EL) device.

SUMMARY OF THE INVENTION

According to this invention, there is provided a method of replacing an atmosphere of an inert gas in a chamber room of a chamber apparatus with outside air. The method comprises: opening a discharge passage of the chamber room; closing a gas supply passage for supplying the inert gas to the chamber room; and forcibly sending outside air into the chamber room, whereby the inert gas inside the chamber room is replaced with outside air.

According to this arrangement, when the atmosphere of the inert gas must be replaced with the outside air inside the chamber room, the outside air is forcibly sent into the chamber room while leaving the discharge passage open. Therefore, the outside air flown into the chamber room operates to force the inert gas out of the chamber room toward the discharge passage. It is thus possible to replace the inert gas with the outside air quickly and efficiently and also to prevent the inert gas from remaining inside the chamber room.

Preferably, the forcible sending of the outside air into the chamber room is carried out by a fan which forcibly sends the inert gas into the chamber room.

According to this arrangement, the fan to be used in sending the inert gas into the chamber room can be availed of in replacing the inert gas with the outside air.

Preferably, the outside air is forcibly sent into the chamber room through the gas supply passage.

According to this arrangement, the gas supply passage for the inert gas can be utilized in replacing the inert gas with the outside air. As a result, the construction of the apparatus for introducing the outside air can be simplified. Further, there is no need of forming in the chamber room an opening for introducing the outside air, with the result that the airtight construction of the chamber room can be simplified.

Preferably, the outside air is forcibly sent to the chamber room through a temperature adjusting apparatus.

According to this arrangement, it is possible to keep the chamber room which is filled inside thereof with the outside air at a desired temperature. For example, in an apparatus which is contained inside the chamber room, the test running operation before the introduction of a workpiece in which an inert gas is not required can be performed in an atmosphere of a design temperature.

According to another aspect of this invention, there is provided a chamber apparatus for housing a workpiece processing apparatus, comprising: a chamber room for housing the workpiece processing apparatus; a gas supply passage for supplying an inert gas into the chamber room, the inert gas supply passage having interposed therein a gas damper; a discharge passage for discharging the atmosphere inside the chamber room, the discharge passage having interposed therein a discharge damper; and a fan for forcibly sending outside air into the chamber room.

According to this arrangement, by driving the fan in a state in which the gas supply passage is blocked by the gas damper and in which the discharge passage is opened by the discharge damper, the inert gas atmosphere inside the chamber room can be easily replaced with the outside air. As a result, the maintenance work can be carried out in a state in which the safety is maintained (i.e., in which the lack of oxygen is prevented). In addition, in this replacement of the inert gas with the outside air, the outside air is forcibly sent by the fan into the chamber room. Therefore, the outside air that has flown into the chamber room functions to force the inert gas out toward the discharge passage, with the result that the replacement with the outside air can be carried out quickly and efficiently and that the remaining inert gas can be minimized.

Preferably, the chamber apparatus further comprises an outside air introduction passage which forms a confluence portion with the gas supply passage on a downstream side of the gas damper and which has interposed therein an outside air damper, wherein the fan is interposed in the gas supply passage on a downstream side of the confluence portion of the outside air introduction passage.

According to this arrangement, since the fan is interposed in the gas supply passage, the fan can be commonly used both for the introduction of the outside air and for the introduction of the inert gas, resulting in a simplification of the apparatus. Further, since the outside air introduction passage is arranged to form a confluence with the gas supply passage, part of the gas supply passage can be used as the outside air introduction passage, part of the gas supply passage can be utilized as the outside air introduction passage and, further, there is no need of forming in the chamber room an opening for introducing the outside air.

Preferably, the chamber apparatus further comprises a temperature adjusting apparatus which is interposed in the gas supply passage between the confluence portion of the outside air introduction passage and the fan.

According to this arrangement, that atmosphere inside the chamber room which is constituted by the outside air can be maintained at a desired temperature. Therefore, in the apparatus for processing the workpiece housed inside the chamber room, it is possible to keep the chamber room which is filled inside thereof with the outside air at a desired temperature. For example, in an apparatus which is contained inside the chamber room, the test running operation before the introduction of a workpiece in which an inert gas is not required (e.g., a test running to confirm the accuracy) can be performed in an atmosphere of a design temperature atmosphere.

Preferably, the chamber apparatus further comprises a filter which is interposed in the gas supply passage on a downstream side of the fan.

According to this arrangement, it is possible to filter by means of the filter not only the inert gas to be introduced but also the outside air to be introduced. Even at the time of introducing the outside air, it is possible to prevent the dirt and dust from coming into the chamber room. It is preferable to use a high efficiency particulate air filter (HEPA) filter.

Preferably, the outside air damper comprises two gate dampers.

In the normal operation of the workpiece processing apparatus, the outside air damper is normally closed in order to maintain the good inert gas atmosphere. However, there is a fear that the outside air gets into the chamber room through a clearance of the damper blade of the outside air damper. According to this arrangement, by constituting the outside air damper by two gate dampers, the outside air passage can be doubly blocked. The incoming of the outside air during the normal operation can thus be surely prevented. It is still more preferable if the two gate dampers are added by one gate valve to thereby triply block the outside air introduction passage.

Preferably, the chamber room is provided with a detachable panel body for maintenance purpose, and the detachable panel is made up of an outer panel and an inner panel which face each other with a clearance therebetween.

According to this arrangement, by removing the detachable panel body, the chamber room can partly be left open. Therefore, there is no possibility of giving rise to the trouble to the maintenance of the workpiece processing. In addition, by making the detachable panel into the double construction of the outer panel and the inner panel, the inert gas inside the chamber room can be prevented from leaking to the extent possible, and the moisture can be prevented from penetrating into the chamber room to the extent possible.

Preferably, the chamber apparatus further comprises: a panel body discharge passage one end portion of which is communicated with the clearance between both the inner and outer panels and an opposite end portion of which is communicated with the discharge passage on an upstream side of the discharge damper; and a panel body discharge damper which is interposed in the panel body discharge passage.

According to this arrangement, even if the inert clearance leaks from the inner panel to thereby stay in the gap between the inner panel and the outer panel, the leaked inert gas flows into the discharge passage through the panel body discharge passage at the time of replacing the inert gas with the outside air. Therefore, even in the clearance between the outer panel and the inner panel, the inert gas can be prevented from remaining therein.

Preferably, the chamber apparatus further comprises: an electromagnetic lock mechanism which locks to close the detachable panel body; and an oxygen concentration measuring means for measuring an oxygen concentration inside the chamber room, wherein the electromagnetic lock mechanism locks and unlocks the detachable panel body depending on a result of measurement by the oxygen concentration measuring means.

According to this arrangement, since the detachable panel body is closed and locked not only when the chamber room is filled with the inert gas, but also when the inert gas remains at the time of replacing the inert gas with the outside air, the detachable panel can surely be prevented from wrongly opened.

Preferably, the chamber apparatus further comprises a control means which controls to open and close the gas damper, the discharge damper and the outside air damper, wherein the control means: controls the gas damper and the discharge damper so as to be opened and the outside air damper so as to be closed at a time of operation with the inert gas; and controls the gas damper so as to be closed and the discharge damper and the outside air damper so as to be opened at a time of introduction of outside air.

According to this arrangement, since the gas damper and the discharge damper are controlled to be opened at the time of operation with the inert gas, the supply of the inert gas into, and the discharging of, the chamber room are carried out in series. As a result, the inert gas atmosphere inside the chamber room can always be kept fresh, and the gas to be generated as a result of processing of the workpiece can adequately be discharged. In addition, the control of the oxygen concentration, or the like, inside the chamber room can be easily performed.

Preferably, the chamber apparatus further comprise a machine room adjacent to the chamber room, and the gas supply passage and the outside air introduction passage are constituted by partitioning the machine room by a partition wall.

According to this arrangement, the ducts for the inert gas and for the outside air (the gas supply passage and the outside air introduction passage) can be directly built into the machine room without the need for providing an exclusively used duct. Therefore, the machine room can be formed simple in construction and compact in size.

Preferably, at least the gas supply passage extends in an up and down direction.

According to this arrangement, the area to be occupied by the machine room can be minimized to the extent possible without impairing the function of the machine room.

The electro-optic apparatus according to this invention preferably comprises the chamber apparatus and the workpiece processing apparatus which is housed inside the chamber apparatus. Preferably, the workpiece processing apparatus is an apparatus for manufacturing an organic EL device.

According to this arrangement, the workpiece processing can be carried out in a favorable atmosphere of the inert gas, and the maintenance work, or the like, of the workpiece processing apparatus can be performed in a safe atmosphere of the outside air. In addition, since the replacement of the inert gas with the outside air can be carried out at a short time, the influence on the tact time (workpiece processing) can be minimized.

Preferably, the apparatus for manufacturing an organic EL device comprises a liquid droplet ejection apparatus which:

carries out relative scanning between a function liquid droplet ejection head having introduced thereinto a light emitting function material and the workpiece in a form of a substrate; and selectively ejects the light emitting function material to thereby form an organic EL function layer in a multiplicity of pixel regions on the substrate.

According to this arrangement, the step for forming the organic EL function layer by ejecting the light emitting function material can be performed in a favorable atmosphere of the inert gas. Therefore, the deterioration in quality of, and damage to, the light emitting function material can be effectively prevented. In addition, as a result of good replacing of the inert gas with the outside air, the ease with which the maintenance work of the liquid droplet ejection apparatus can be carried out is not impaired.

Preferably, the organic EL function layer is at least an EL light emitting layer out of the EL light emitting layer and a hole injection layer.

According to this arrangement, the portion which forms the main part of the light emitting function in the organic EL device can be formed by the function liquid droplet ejection head. Therefore, it is possible to accurately form more minute pixels to thereby manufacture an organic EL device of high resolution and high image quality.

Preferably, the organic EL device is manufactured by the above-described electro-optic apparatus.

According to this arrangement, the organic EL device of high quality and high yield can be provided at a lower cost.

BRIEF DESCRIPTION OF THE DRAWINGS

The above and other features of this invention will become readily apparent by reference to the following detailed description when considered in conjunction with the accompanying drawings wherein:

FIG. 4 is an outside side view of the imaging apparatus according to this invention;

FIG. 5 is an outside plan view of the imaging apparatus according to this invention;

DETAILED DESCRIPTION OF THE PREFERRED EMBODIMENT

With reference to the accompanying drawings, a description will now be made about the embodiment of this invention. An ink jet head (function liquid droplet ejection head) of an ink jet printer is capable of ejecting minute ink droplets (liquid droplets) in a dot form (or in the shape of dots) at a high accuracy. Therefore, by using special inks, light emitting resins, photosensitive resins, or the like, as the function liquid droplets (liquid to be ejected), the ink jet head is expected to be capable of being applied to the field of manufacturing various parts.

An electro-optic apparatus according to this embodiment is applied to the manufacturing of a so-called flat display of, e.g., an organic electroluminescent (organic EL) device, or the like. The electro-optic apparatus is used to form, in an atmosphere of an inert gas, an EL light emitting layer and a hole injection layer for each of pixels which perform the light emitting function of the organic EL device.

In this embodiment, a description will be made about the electro-optic apparatus which is applied to the apparatus for manufacturing an organic EL device, as well as about the structure of the organic EL device to be manufactured thereby and also about the method (process) of manufacturing the organic EL device.

Figure 1:
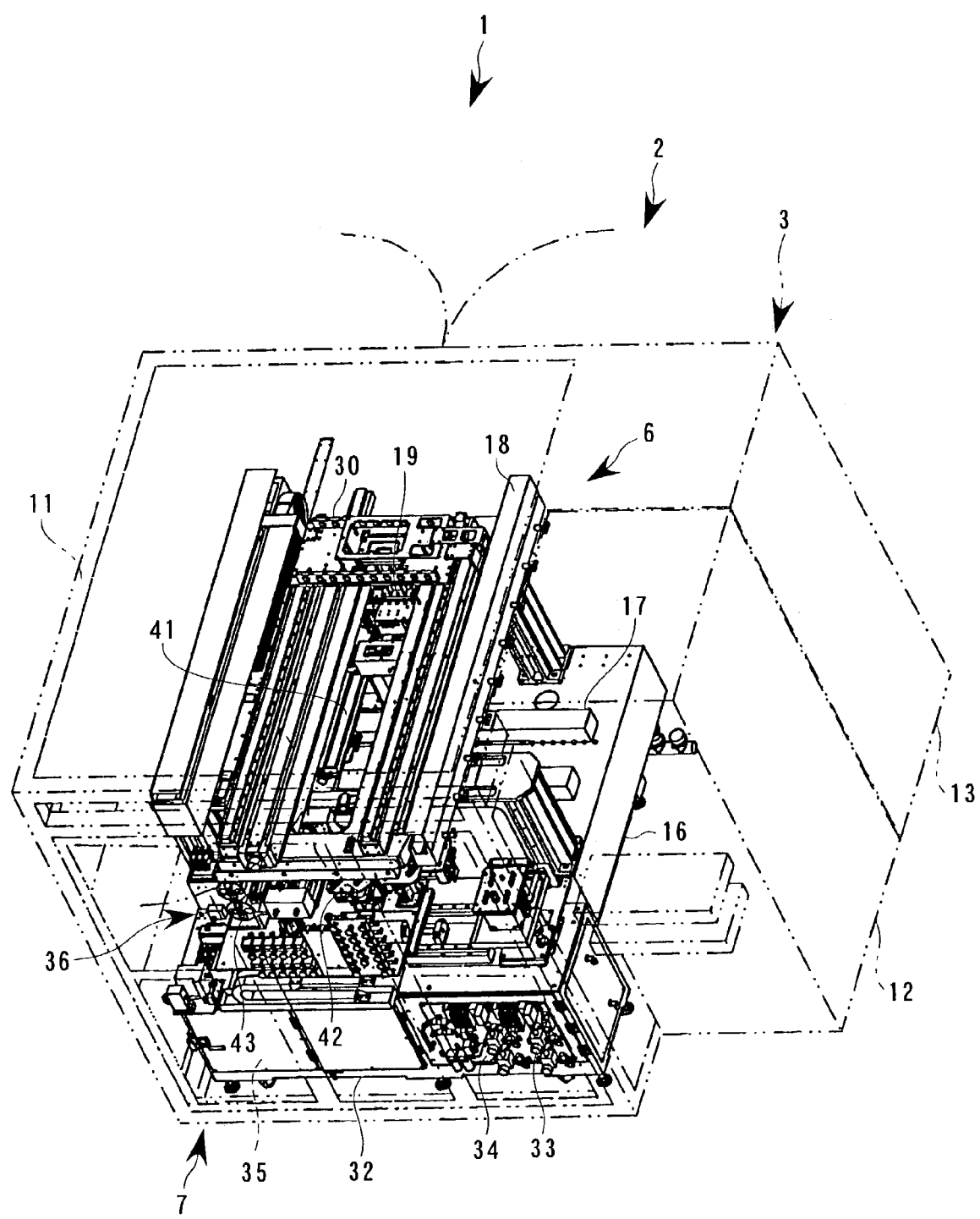
FIG. 1 is an outside perspective view of an electro-optic apparatus according to this invention.
Figure 2:
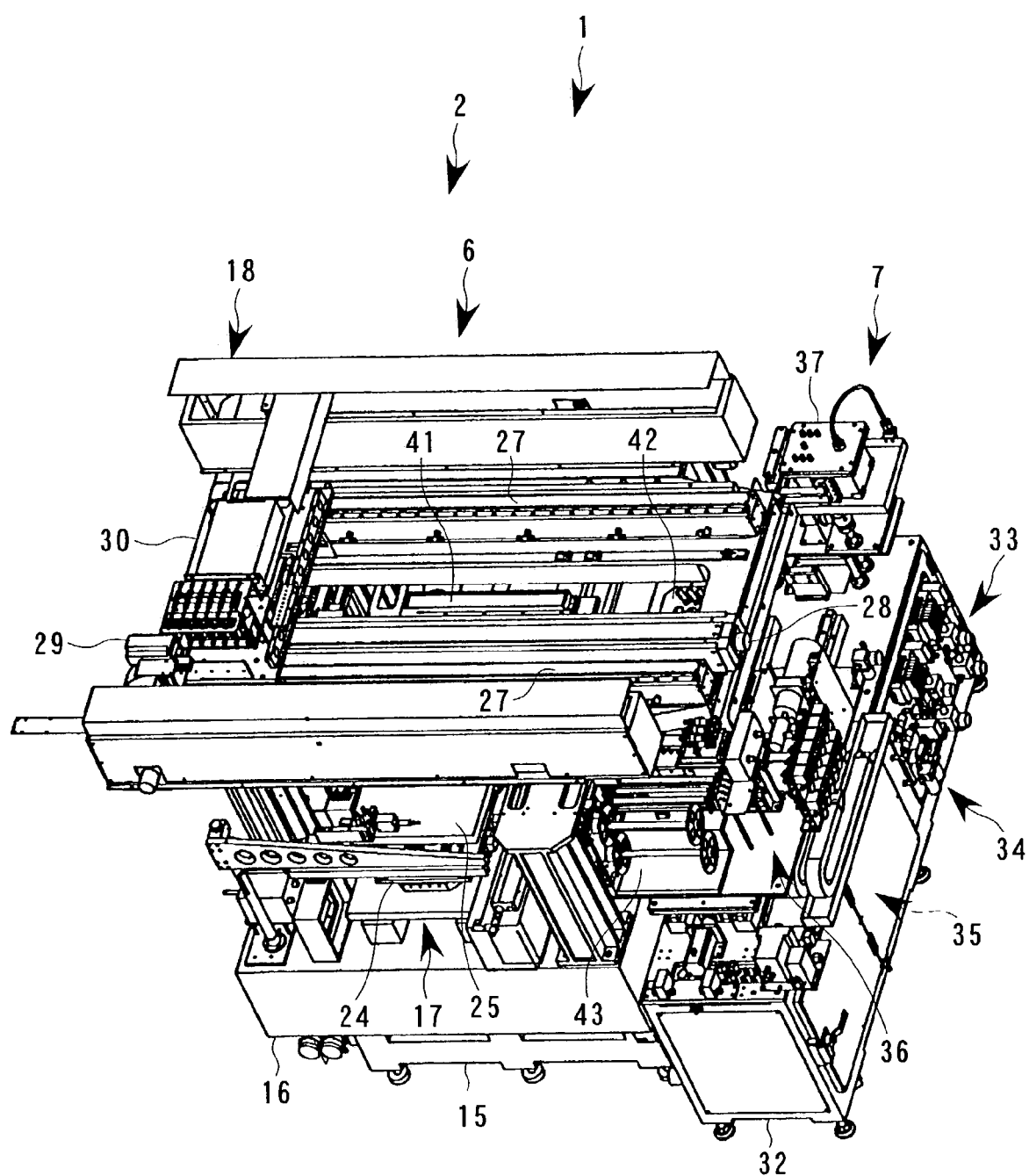
FIG. 2 is an outside perspective view of an imaging apparatus according to this invention.
Figure 3:
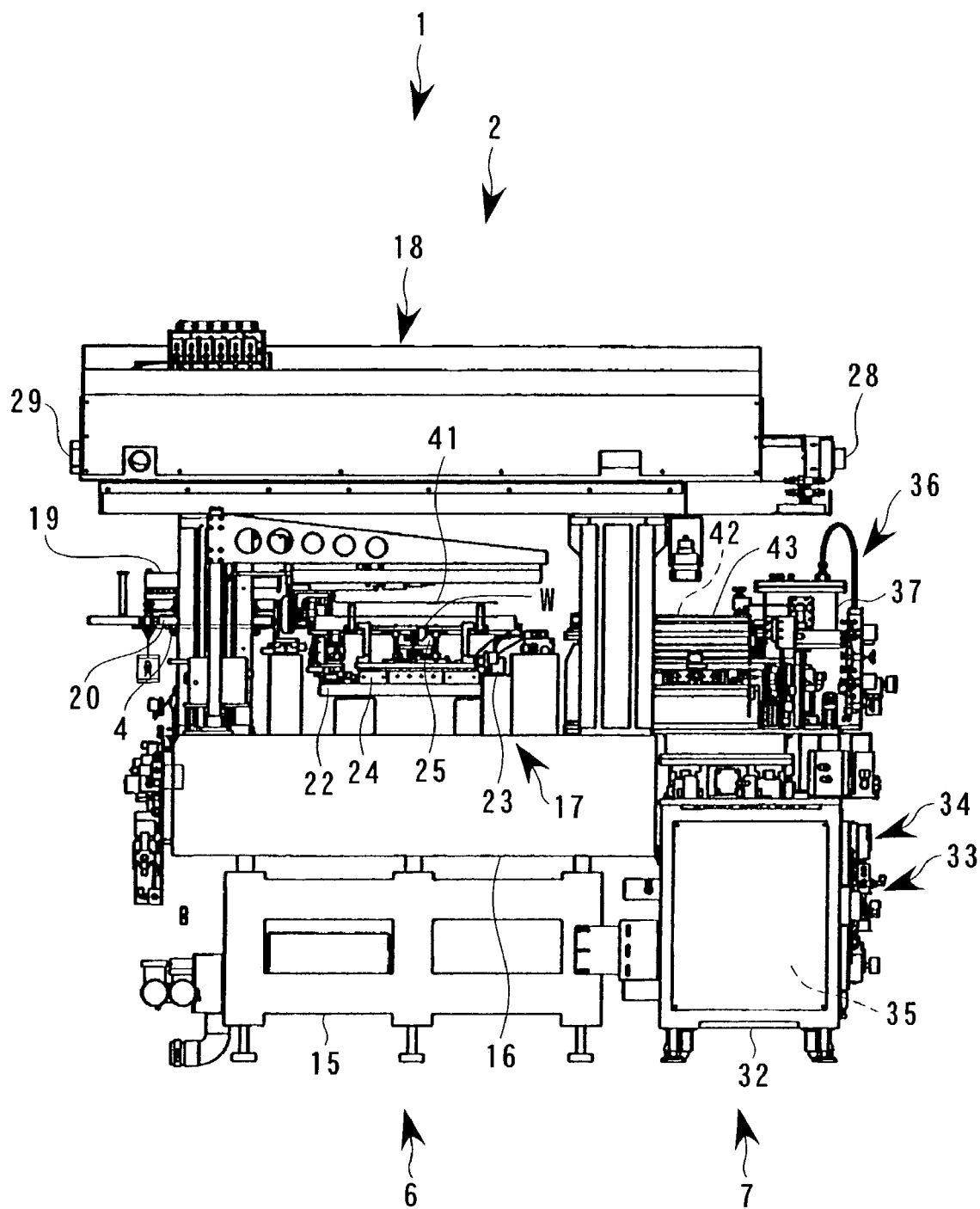
FIG. 3 is an outside front view of the imaging apparatus according to this invention.

As shown in FIG. 1, the electro-optic apparatus 1 of this embodiment is made up of an imaging apparatus (apparatus for forming an image or a picture) 2 and a chamber apparatus 3 which houses or contains therein the imaging apparatus 2. By means of a function liquid droplet ejection head 4 (see FIG. 3) mounted on the imaging apparatus 2, the light emitting material is ejected to thereby form an EL light emitting layer and a hole injection layer. A series of manufacturing processes (steps) inclusive of the ejection operation of the function liquid droplet ejection head 4 are arranged to be performed in an atmosphere of an inert gas (nitrogen gas) which is secured by the chamber apparatus 3.

Although details are described hereinafter, the imaging apparatus 2 is provided with a liquid droplet ejection apparatus 6 and an auxiliary apparatus 7 which is made up of various apparatuses auxiliary to the liquid droplet ejection apparatus 6. The chamber apparatus 3 is made in a form of a so-called clean room and has an electrical room 12 and a mechanical (or machine) room 13 which are disposed in a side by side relationship. The chamber room 11 is filled with nitrogen gas which is an inert gas. The above-described liquid droplet ejection apparatus 6 and the auxiliary apparatus 7 are exposed to the atmosphere of nitrogen gas as a whole and are operated in the atmosphere of nitrogen gas.

As shown in FIGS. 2 through 5, the liquid droplet ejection apparatus 6 is made up of: a supporting rack 15 disposed on a floor; a stone base 16 disposed on the supporting rack 15; an X-axis table 17 which is disposed on the stone base 16 and a Y-axis table 18 which crosses the X-axis table 17 at a right angle; a main carriage 19 disposed in a manner to be suspended from the Y-axis table 18; and a head unit 20 mounted on the main carriage 19.

The X-axis table 17 has an X-axis air slider 22 and an X-axis linear motor 23 which constitute the X-axis driving system. A Θ-axis table 24 and a suction table 25 which pneumatically sucks a substrate W are mounted on the X-axis table 17. The Y-axis table 18 has a pair of Y-axis sliders 27, 27, a Y-axis ball screw 28, and a Y-axis motor (servomotor) 29 which constitute the Y-axis driving system. A bridge plate 30 for suspending the main carriage 19 is mounted on the Y-axis table 18.

The head unit 20 mounted on the main carriage 19 has mounted thereon, through a subsidiary carriage (sub-carriage), a plurality of function liquid droplet ejection heads 4. Though the details are not shown, the sub-carriage has mounted thereon twelve function liquid droplet ejection heads 4. These function liquid droplet ejection heads 4 are disposed in two groups of six each (in FIG. 6, they are divided into the front and rear groups) at a predetermined inclination (see FIG. 6).

The liquid droplet ejection apparatus 6 of this embodiment has a construction in which the substrate W is moved in a manner synchronized with the driving of the function liquid droplet ejection head 4 (selective ejection of the function liquid droplet). The so-called main scanning of the function liquid droplet ejection head 4 is carried out by the back and forth movements of the X-axis table 17 in the X-axis direction. The so-called subsidiary scanning (sub-scanning) in correspondence to the main scanning is carried out by the back and forth movements of the X-axis table 17 in the Y-axis direction.

On the other hand, the home position of the head unit 20 is set to be in the rear end position in FIG. 1. From the rear side of this liquid droplet ejection head 6, the head unit 20 is brought into or taken out for replacement (details will be given hereinafter). To the left side in the figure, a substrate transportation apparatus (not illustrated) faces, and the substrate W is carried into, or carried out from, the left side of the figure. To this side (i.e., in the side of the viewer) in the figure of the liquid droplet ejection apparatus 6, there are integrally disposed main constituting apparatuses of the above-described auxiliary apparatus 7.

The auxiliary apparatus 7 is made up of: that common machine base 32 of a cabinet form which is disposed next to the supporting rack 15 and the stone base 16; an air supply apparatus 33 and a vacuum suction apparatus 34 which are contained or housed inside one half of the common machine base 32; a function liquid supply and recovery apparatus 35 whose parts are contained in the other half of the common machine base 32 the main apparatuses; and a maintenance apparatus 36 which contains on the common machine base 32 the main parts. In the figure, reference numeral 37 denotes that intermediate tank of the function liquid supply and recovery apparatus 35 which is interposed between a main tank (not illustrated) and the head unit 20.

The air supply apparatus 33 constitutes a pressure supply source of the function liquid supply and recovery apparatus 35 and is used as the driving source of the air pressure actuator for the maintenance apparatus 36, or the like. The vacuum suction apparatus 34 is connected to the suction table 25 and sucks the workpiece W into position by air suction. The function liquid supply and recovery apparatus 35 supplies the function liquid to the function liquid ejection head 4 and also recovers the function liquid that has been disposed of (or wasted) from the maintenance apparatus 36, or the like.

The maintenance apparatus 36 is made up of: a flushing unit 41 which is subjected to a periodic flushing in which the function liquid droplet ejection head 4 is subjected to periodic flushing work (ejection work to discard the function liquid from all of the ejection nozzles); a cleaning unit 42 which carries out the suction and holding of the function liquid droplet of the function liquid droplet ejection head 7; and a wiping unit 43 which wipes out the nozzle forming surface of the function liquid droplet ejection head 4. The cleaning unit 42 and the wiping unit 43 are disposed on the common machine base 32. The flushing unit 41 is disposed on the X-axis table (Θ-axis table 24) 17 near the substrate W.

Figure 6:
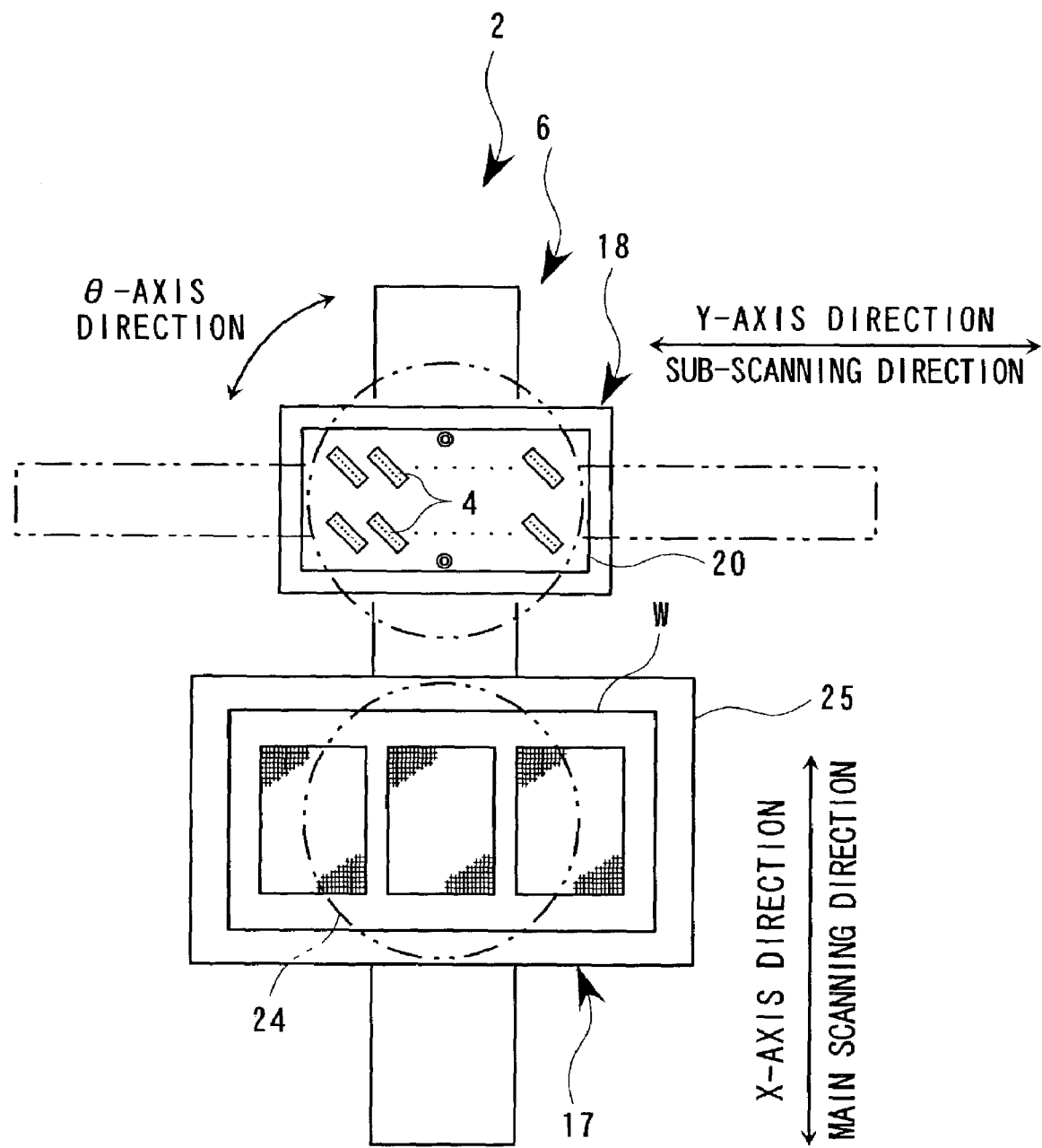
FIG. 6 is a schematic diagram showing a liquid droplet ejection apparatus of the imaging apparatus according to this invention.

Here, with reference to a schematic diagram in FIG. 6, a brief description will be made about the series of operations of the imaging apparatus 2 which operates in the atmosphere of nitrogen gas inside the chamber apparatus 3. First, as a preparatory step, the head unit 20 is brought into the liquid droplet ejection apparatus 6 and is set in position on the main carriage 19. Once the head unit 20 has been set in position on the main carriage 19, the Y-axis table 18 moves the head unit 20 to a position of a head recognition camera (not illustrated) to thereby recognize the position of the head unit 20 by means of the head recognition camera. Based on the result of this recognition, the head unit 20 is corrected in respect of a Θ-axis direction, and the head unit 20 is subjected to a positional correction in respect of the X-axis direction and the Y-axis direction in terms of the data. After the positional correction, the head unit 20 (main carriage 19) returns to the home position.

On the other hand, once the substrate W (in this case, each of the substrates) is introduced into the suction table 25 of the X-axis table 17, the substrate recognition camera (not illustrated) recognizes the position of the substrate W at the position of introduction. Based on the result of this recognition, the substrate W is corrected by the Θ-axis table 24 in respect of the Θ-axis direction, and a positional correction of the substrate W in respect of the X-axis direction and the Y-axis direction is performed in terms of the data.

Once the preparations have been finished as described above, in the actual liquid droplet ejection work, the X-axis table 17 is first driven to thereby move the substrate W back and forth in the main scanning direction. The plurality of function liquid droplet ejection heads 4 are also driven to thereby perform the work of selective ejection of the function liquid droplet onto the substrate W. After the substrate W has returned, the Y-axis table 18 is then driven to thereby move the head unit 20 by one pitch in the subsidiary scanning direction. In this manner, the back and forth movement of the substrate W and the driving of the function liquid droplet ejection head 4 are carried out again. By repeating these operations several times, the liquid droplet can be ejected from end to end over the entire region of the substrate W.

In parallel with the above operations, the head unit 20 (function liquid droplet ejection head 4) of the liquid droplet ejection apparatus 6 is continuously supplied with the function liquid from the function liquid supply and recovery apparatus 35 by means of the air supply apparatus 33 as the pressure supply source. In the suction table 25, the workpiece W is sucked by air by means of the vacuum suction apparatus 34. Before the liquid droplet ejection work, the head unit 20 is caused to face the cleaning unit 42 and the wiping unit 43 so as to perform the suction of the function liquid from all of the nozzles of the function liquid droplet ejection head 4 and subsequent wiping of the nozzle forming surface. During the liquid droplet ejection work, the head unit 20 is adequately caused to face the flushing unit 41 to thereby perform the flushing of the function liquid droplet ejection head 4.

In this embodiment, the workpiece W which is the object to which the droplets are ejected is arranged to move in the direction of the main scanning (in the X-axis direction). It may, of course, be so arranged that the head unit 20 is moved in the main scanning direction. Or else, it may also be so arranged that the head unit 20 is held stationary and that the workpiece W is moved in the main scanning direction and in the sub-scanning direction.

Now, with reference to the flow sheet in FIG. 7 as well as to the structural drawings in FIGS. 8 through 13, a description will be made about the chamber apparatus 3. In the description of the chamber apparatus, the lower side of the drawing sheet of FIG. 8 is defined as the "front," the upper side thereof is defined as "rear," the left side thereof is defined as "left," and the right side is defined as "right."

The chamber apparatus 3 is made up of: a chamber room 11 which contains or houses therein the imaging apparatus 2; the electrical room 12 which is parallelly disposed on the right front portion of the chamber room 11; and the machine room 13 which is parallelly disposed on the right rear portion of the chamber room 37. As the inert gas to be charged into the chamber room 11, there may preferably be used one of nitrogen, helium, neon, argon, krypton, xenon, and radon. In this embodiment, nitrogen is used with due consideration to the cost and safety.

The inert gas (nitrogen gas) is introduced from a gas manufacturing apparatus (not illustrated) into the machine room 13 through a gas introduction unit 101 and is subjected therein to conditioning for further introduction into the chamber room 11. The inert gas inside the chamber room 11 is appropriately discharged or vented through a discharge duct (discharge passage) 102 which is added to the left front portion of the chamber room 11 and is sent to a gas treatment apparatus (not illustrated). In actual operation, the supply of the inert gas to the chamber room 11 and the discharging (or exhausting) of the chamber room 11 are continuously performed so that the atmosphere inside the chamber room 11 is constituted by the inert gas that flows slightly.

The chamber room 11 is of a prefabricated type which is assembled by mutually sealing, with an airtight material, a left side wall 111, a right side wall 112, a front-side detachable panel unit 113, a rear side detachable panel unit 114, a floor wall 115, and a ceiling wall 116. On the other hand, the liquid droplet ejection apparatus 6 which is housed inside the chamber room 11 is housed in a posture with the back and forth direction being defined as the Y-axis direction and with the left and right direction being defined as the X-axis direction (see FIG. 1). Taking into consideration the maintenance work, or the like, the auxiliary apparatus 7 of the imaging apparatus 2 is disposed to face the front side detachable panel unit 113. Taking into consideration the carrying the head unit 26 into position, the home position side of the head unit 20 is arranged to face the rear side detachable panel unit 114. The left side wall 111 has formed therein a shutter-equipped handover opening 117 for carrying the substrate W into and out of the chamber room 11 (see FIG. 11).

Both the front side detachable panel unit 113 and the rear side detachable panel unit 114 have a double construction made up of an inner panel unit 121 and an outer panel unit 122. The inner panel unit 121 is made up of: a frame body 123 which has a vertical frame 123a in an intermediate portion as seen in the left and right direction; and a pair of inner panels 124, 124 with respective windows, the inner panels being respectively detachably mounted into left and right opening portions (maintenance openings) constituted by the vertical frame 123a (see FIG. 13). Each of the inner panels 124 is provided with left and right handles and a plurality of locking levers (both not illustrated). The inner panel 124 is attached to the frame body 123 with the left and right ends as well as the top and bottom ends thereof so as to be hermetically mounted on the frame body 123 by means of the plurality of locking levers.

Figure 13A:
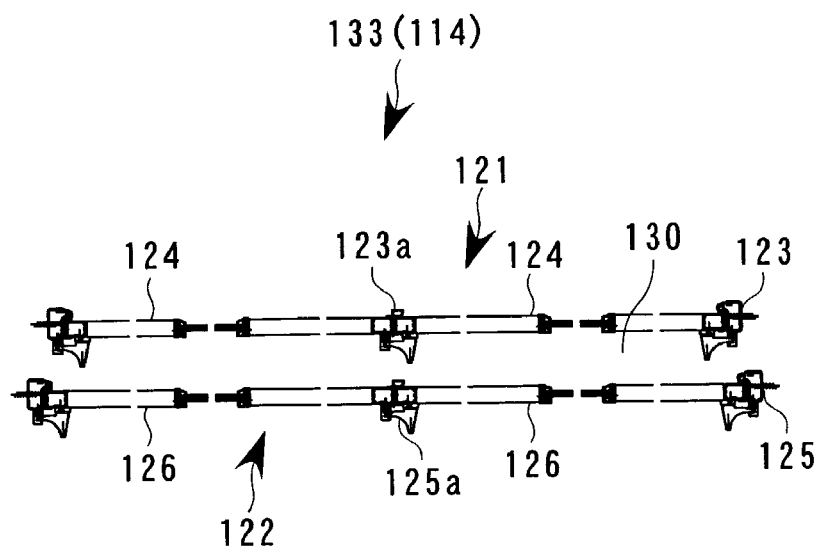
FIG. 13A is a horizontal sectional view of, and FIG. 13B is a lateral sectional view of, detachable panel units of the chamber apparatus according to this invention.
Figure 13B:
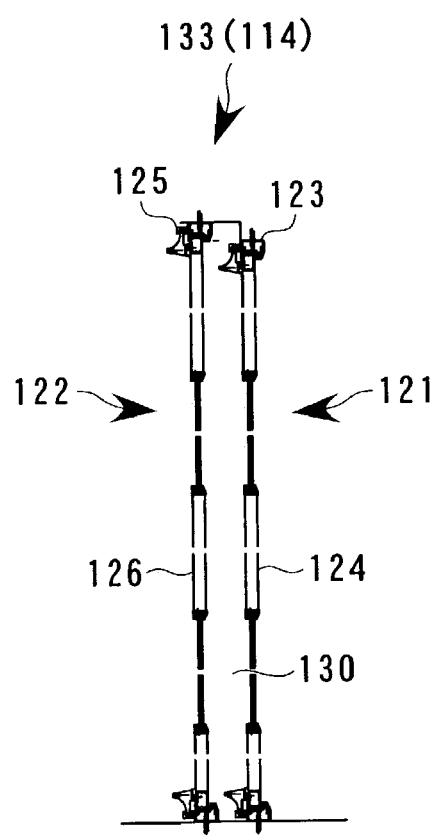

Similarly, the outer panel unit 122 is made up of: a frame body 125 which has a vertical frame 125a in an intermediate portion as seen in the left and right direction; and a pair of outer panels 126, 126 with respective windows, the outer panels being respectively detachably mounted into left and right opening portions (maintenance openings) constituted by the vertical frame 125a (see FIG. 13). Each of the outer panels 126 is provided with left and right handles 127, 127 and a plurality of locking levers 128. The outer panel 126 is attached to the frame body 125 with the left and right ends as well as the top and bottom ends thereof so as to be hermetically mounted on the frame body 125 by means of the plurality of locking levers 128. The outer panel unit 122 is formed slightly larger in width and longer in height than the inner panel unit 121 to avoid possible confusion in mounting and detaching work of the inner and outer panels 121, 122 (see FIG. 13).

Each of the inner and outer panels 124, 126 has a plurality of electromagnetic locking devices 129 which are built into an upper portion thereof so that the inner and outer panels 124, 126 can be locked and unlocked depending on the oxygen concentration inside the chamber room 11 (details are described hereinafter). In other words, the front detachable panel unit 113 and the rear detachable panel unit 114 are interlocked by the electromagnetic locking devices 129.

A gas supply port 131 which is communicated with the machine room 13 is formed in a rear upper portion of the right side wall 112, and a discharge port 132 which is communicated with the discharge duct 102 is correspondingly formed in a front lower portion of the left side wall 111. A filter chamber 133 which is communicated with the gas supply port 131 is formed in the ceiling portion of the chamber room 11. The filter chamber 133 is constituted by horizontally partitioning the ceiling portion by means of a lattice-shaped filter mounting frame 134. A plurality (four in number) of filters (high efficiency particulate air filters, HEPA filters) 135 are mounted on the filter mounting frame 134 (see FIG. 8).

The inert gas that has flown from the gas supply port 131 flows into the filter chamber 133 and, after passing through these plurality of filters 135, flows into the upper portion of the liquid droplet ejection apparatus 6. In this case, the inert gas that has flown from the gas supply port 131 does pass through the filters (filter chamber 133) 135, but the main part of the gas flow is arranged to flow inside the chamber room 11 in a diagonal direction to thereby reach the discharge port 132. The region in which the liquid droplet ejection operation of the liquid droplet ejection apparatus 6 is performed, i.e., the ejection area, lies to face the main diagonal gas flow passage.

In other words, the main stream of the inert gas flows inside the chamber room 11 so as to enclose the ejection area, and the gas flow as a whole flows, after having flown downward through the filters, toward the discharge port 132. According to this arrangement, the ejection area is constantly exposed to the atmosphere of fresh inert gas. The gas flow velocity at this time is adjusted to the value in which the function liquid droplet ejected from the function liquid droplet ejection head 4 does not give rise to a crooked flight (or a crooked course of traveling).

The machine room 13 is provided at an upper portion thereof with the gas introduction unit 101 which is communicated with a gas manufacturing apparatus (not illustrated). The machine room 11 is partitioned inside thereof with a partition wall 137 as required so as to form a gas passage (gas flow passage) 138 which reaches from the gas introduction unit 101 to the gas supply port 131. In other words, the machine room 13 has formed therein in an integral manner a duct which serves as the gas passage 138.

The gas introduction unit 101 has assembled therein a gas damper unit 141 which is made up of: a gas gate valve (solenoid valve) 142; a gas adjusting damper (motor-operated valve: highly hermetically sealable motor-operated damper) 143; and a gas gate valve (highly hermetically sealable motor-operated damper) 144 (see FIG. 7), as seen from the upstream side downward. As described above, the chamber apparatus 3 in this embodiment employs an operation mode in which the supply of the inert gas and the discharging are performed continuously. In a state in which the gas gate valve 142 and the gas gate valve (damper) 144 are kept opened, the amount of supplying (supplementing) the inert gas is adjusted by the gas adjusting damper 143. In the operation to replace the atmosphere inside the chamber room with outside air (open air) which is described hereinafter, the gas gate valve 142, the gas adjusting damper 143 and the gas gate valve 144 are all controlled to be closed.

The gas passage 138 which is constituted inside the machine room 13 extends from the gas introduction unit 101 to the bottom side of the machine room 13, where it makes a U-turn to thereby reach the gas supply port 131 on the upper part. In that part of the gas passage 138 which goes upward, there is built in a gas conditioner 155 which is described hereinafter.

Figure 7:
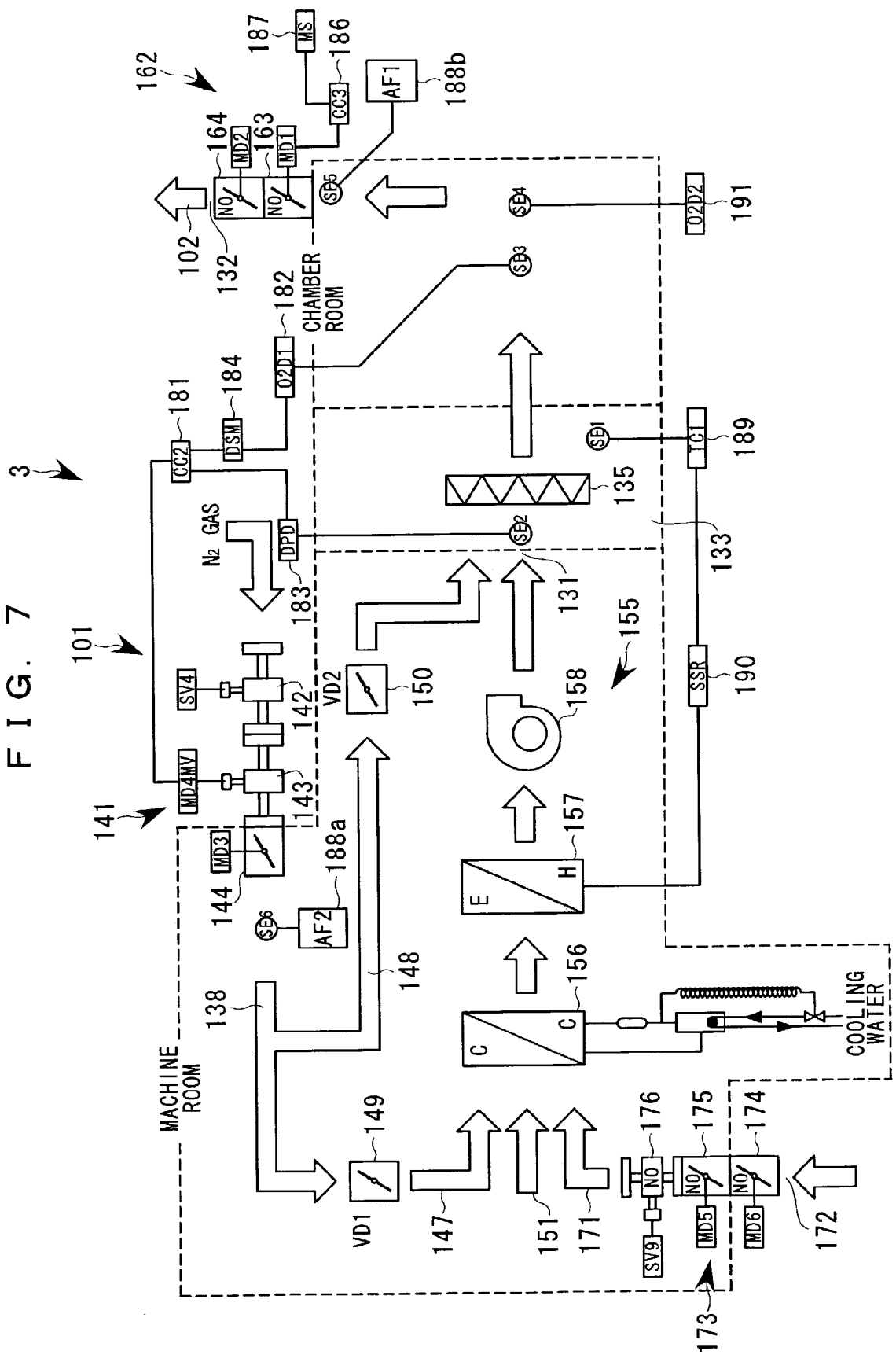
FIG. 7 is a system flow diagram of the imaging apparatus according to this invention.
Figure 8:
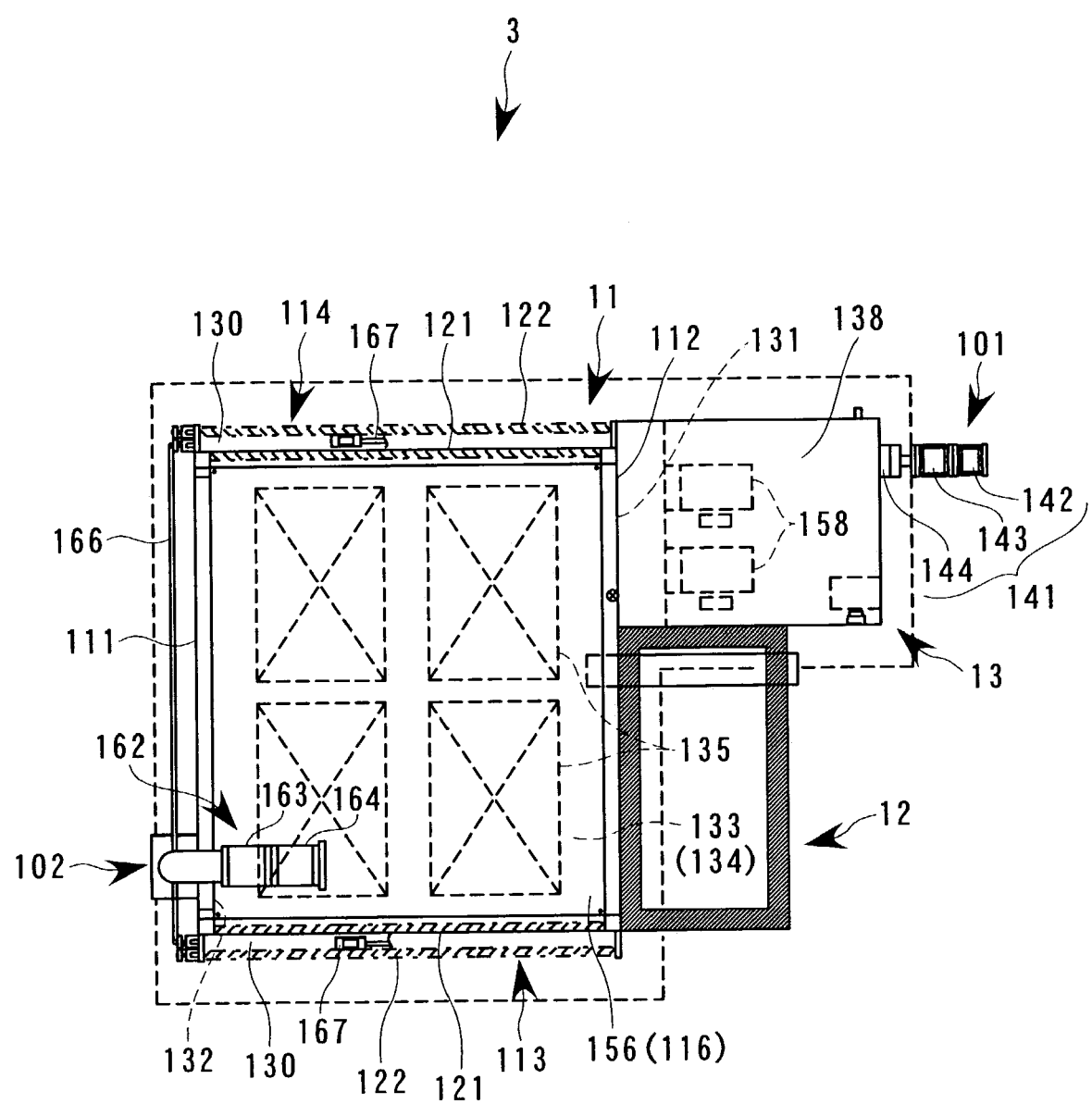
FIG. 8 is a plan view showing a chamber apparatus according to this invention.

As shown in FIG. 7, the gas passage 138 is branched on the downstream side of the gas introduction unit 101 into: one of main gas passage 147 which extends from the gas introduction unit 101 through the gas conditioner 155 to the gas supply port 131; and the other of bypass gas passage 148 which extends from the gas introduction unit 101 directly to the gas supply port 131. The main gas passage 147 and the bypass gas passage 148 are provided respectively with manually operated dampers 149, 150 for switching the flow passages. These dampers 149, 150 are used only at the time of initial adjustments when the chamber apparatus 3 is installed.

As shown only in FIG. 7, the chamber room 11 has formed therein a return flow passage (return opening) 151. An arrangement is made such that a return gas in the chamber room 11 is returned to the machine room 13 through this return flow passage 151 and merges into the main gas passage 147 on the upstream side of the gas conditioner 155. This return of the gas is only supplementary, and the gas will not be returned during normal operation.

The main gas passage 147 has interposed therein the gas conditioner 155 which is made up of: a cooler (chilling unit) 156; a heater (an electric heater) 157; and two fans (sirocco fans) 158, 158. The cooler 156 and the heater 157 are disposed next to each other in an intermediate position as seen in the vertical direction of the machine room, thereby constituting a temperature adjusting apparatus. By this arrangement, the atmosphere of inert gas inside the chamber room 11 is maintained at a predetermined temperature, e.g., 20° C.±0.5° C. in this embodiment.

The fans 158 are disposed close to the gas supply port 131 on an upper portion of the machine room 13. The inert gas that has been introduced from the gas introduction unit 101 is forcibly sent by these fans 158 into the chamber room 11 through the gas supply port 131. Control is thus made by these fans 158 of the amount of supply of the inert gas into the chamber room 11 and the gas flow velocity inside the chamber room 11, or the like.

The discharge duct 102 which constitutes the gas discharge passage has a discharge chamber 161 near the discharge port 132, and rises from this discharge chamber 161 to extend horizontally along the upper surface of the chamber room 11. On a downstream side of the discharge duct 102 (in the portion which lies on the upper surface of the chamber room 11), there is interposed a discharge damper unit 162 which is made up of a discharge adjusting damper 163 and a discharge gate damper 164 (see FIG. 7). The amount of gas to be discharged is adjusted by this discharge adjusting damper 163.

Figure 9:
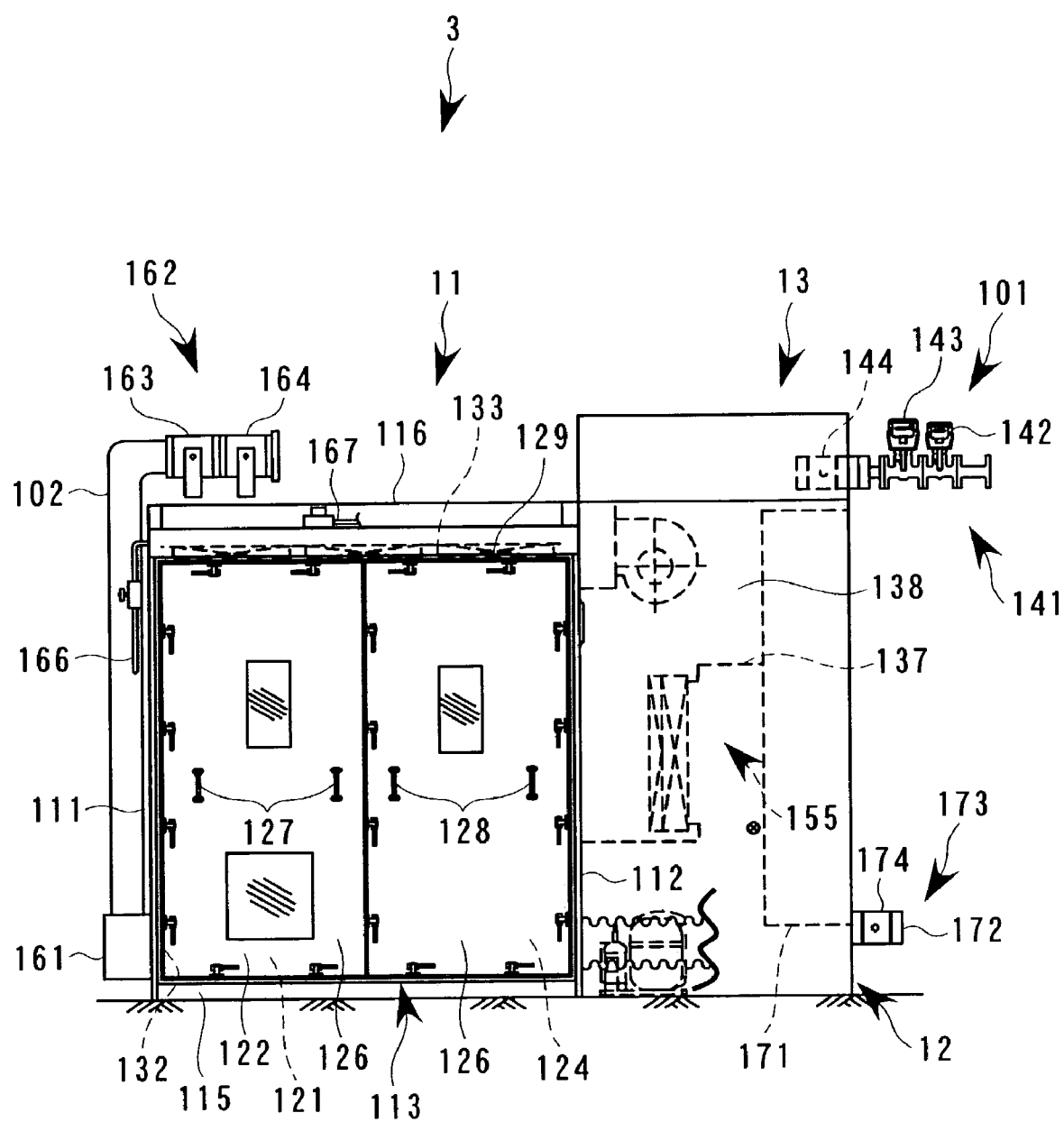
FIG. 9 is a front view showing the chamber apparatus according to this invention.
Figure 10:
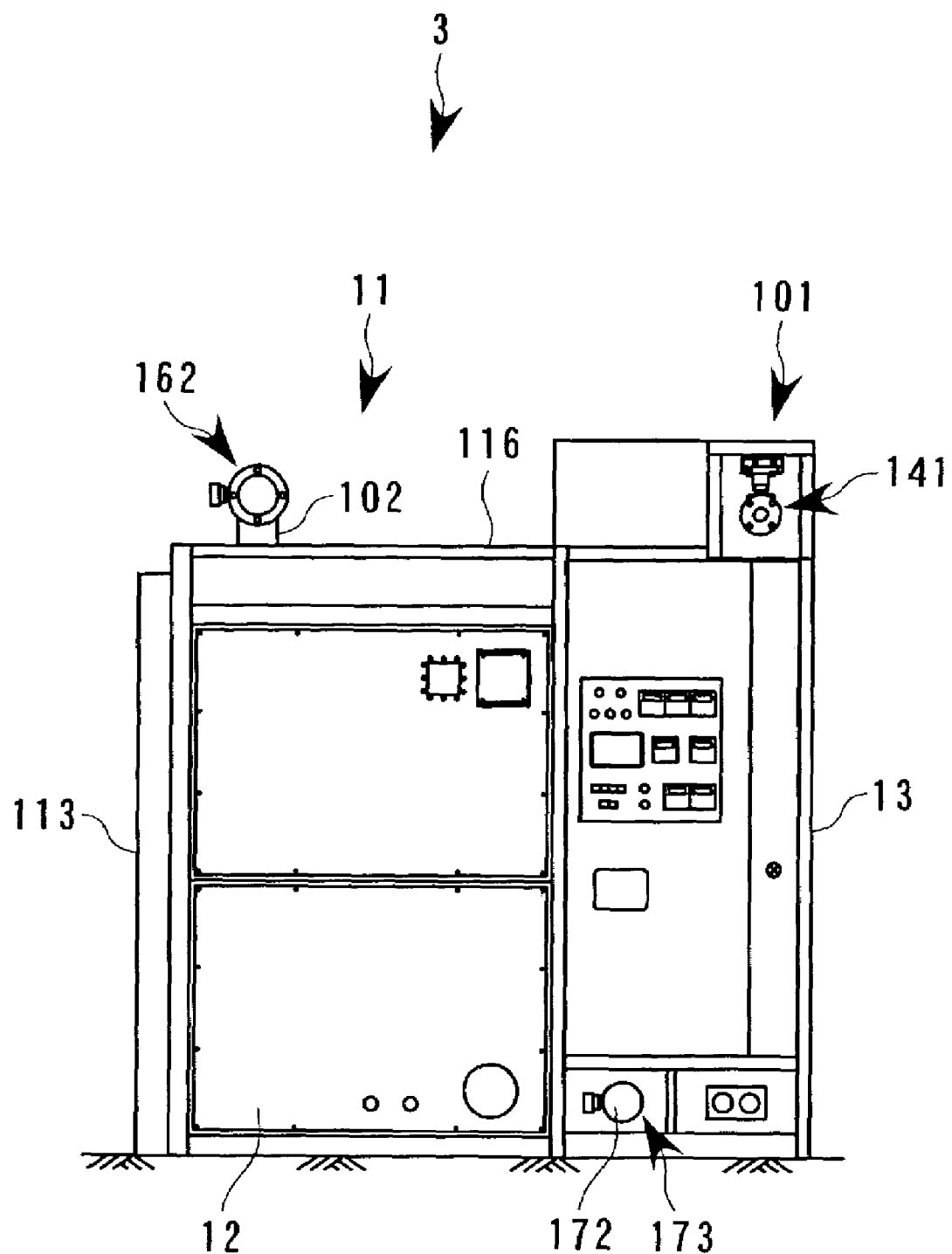
FIG. 10 is a right side view showing the chamber apparatus according to this invention.
Figure 11:
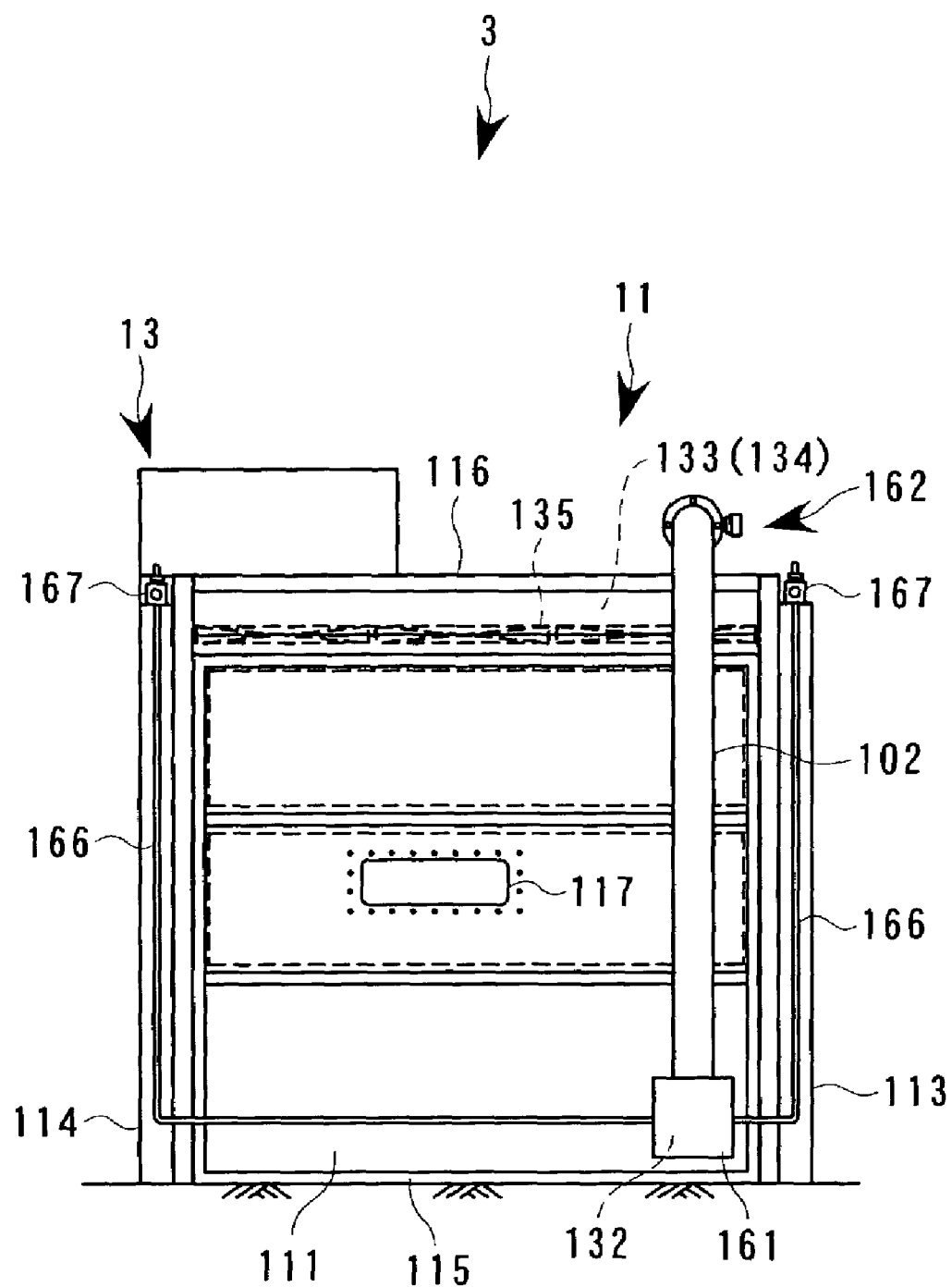
FIG. 11 is a left side view showing the chamber apparatus according to this invention.
Figure 12:
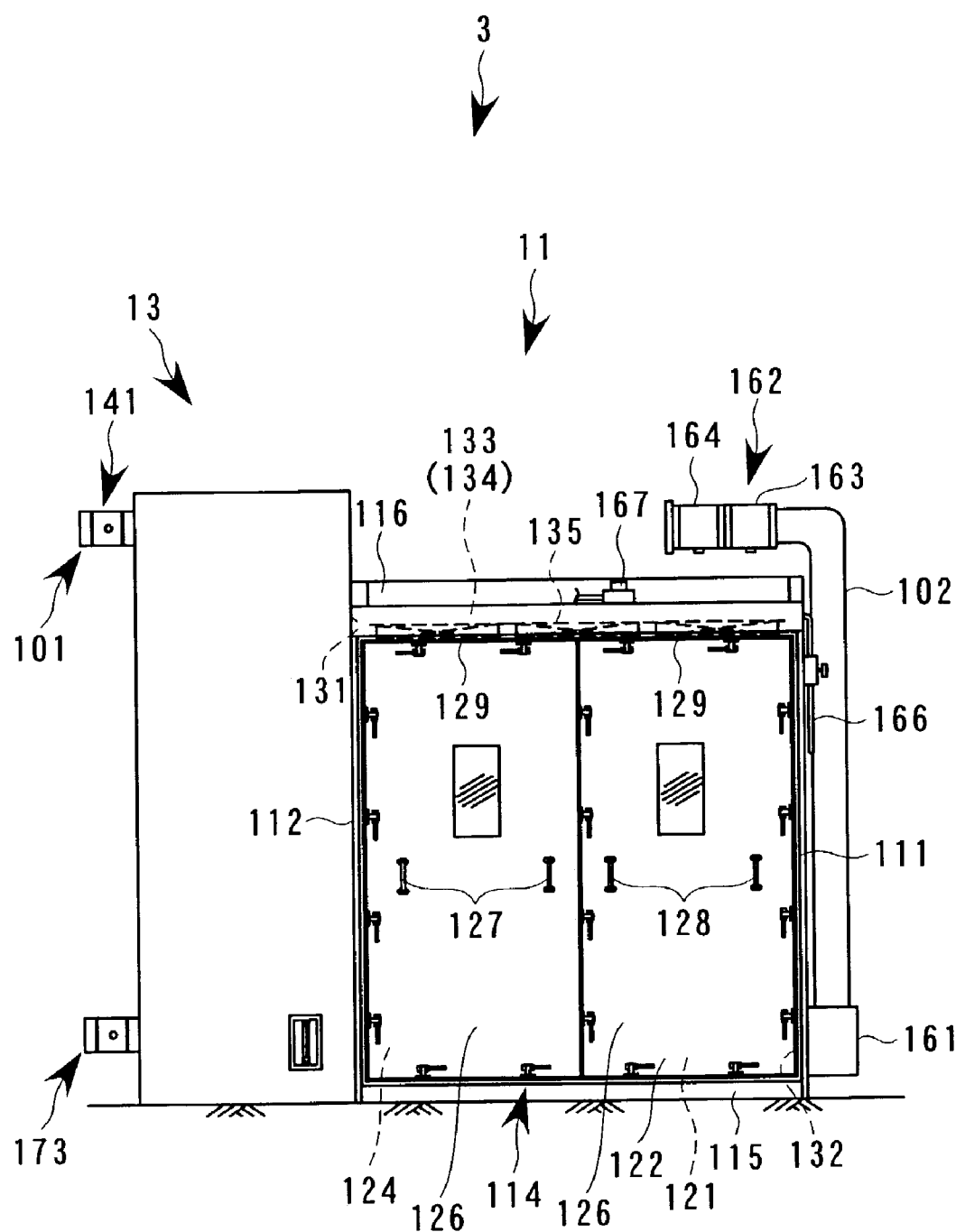
FIG. 12 is a rear view showing the chamber apparatus according to this invention.

The discharge chamber 161 has connected thereto two discharge pipes (panel body discharge passages) 166, 166 which extend from the front detachable panel unit 113 and the rear detachable panel unit 114 respectively (see FIGS. 8, 9, 11). The upstream end of each of the discharge pipes is communicated with the clearance between the inner panel unit 121 and the outer panel unit 122. Each of the discharge pipes 166 has interposed therein a discharge valve (panel body discharge damper) 167. It is thus so arranged that the inert gas that has leaked into the clearance 130 between the inner and outer panel units 113, 114 can be discharged (details will be given hereinafter).

On the upstream side of the gas conditioner 155, the main gas passage 147 merges with an outside air passage 171 which is constituted by the partition wall 137 inside the machine room 13 (see FIG. 7). An outside air introduction port 172 in the outside air passage 171 opens to the side surface at the lower portion of the machine room 13. The downstream end of the outside air passage 171 merges into the main gas passage 147 on the upstream side of the cooler 156. The outside air passage 171 has interposed therein an outside air damper unit 173 which is made up, in the order as seen from the outside air introduction port 172, of an outside air gate damper 174, an outside air adjusting damper 175, and an outside air gate valve 176.

In this arrangement, the outside air gate damper 174 and the outside air adjusting damper 175 are constituted by a highly hermetically sealable dampers, and the outside air gate valve 176 is constituted by a solenoid valve (or a motor-operated two-way valve). Though details are given hereinafter, at the time of operation in which the atmosphere inside the chamber room is replaced with the outside air, the outside air gate damper 174, the outside air adjusting damper 175, and the outside air gate valve 176 are all controlled to be opened, and the flow adjustment of the outside air is carried out by the outside air adjusting damper 175. At the time of ordinary operation, on the other hand, these dampers 174, 175 and the valve 176 are all controlled to be closed. Due to the highly hermetic sealing properties and the number of the valve and dampers, the outside air is surely prevented from entering the chamber room.

A description will now be made briefly about the method of operating the chamber apparatus 3. Under normal operating conditions in which the inert gas is introduced into the chamber room 11, the gas damper unit 141 and the discharge damper unit 162 are opened in a state in which the outside air damper unit 173 is kept closed. The supply and discharging of the inert gas into, and out of, the chamber room 11 are carried out by the fans 158 to thereby constitute the atmosphere.

The gas adjusting damper 143 has connected thereto, through a controller 181, an oxygen meter (for low concentration) 182 and a moisture meter 183 which are disposed inside the chamber room 11. Based on the results of measurements by these meters, the amount of supply of the inert gas is adjusted, In concrete, the oxygen concentration and the moisture content inside the chamber room 11 are controlled by the gas adjusting valve 143 below 10 ppm, respectively. Reference numeral 184 in the figure denotes a scaling meter to show the oxygen concentration.

The discharge damper 163 has connected thereto a pressure gauge 187 through a controller 186. Based on the result of measurement by the pressure gauge 187, the amount of discharging of the inert gas is adjusted. In other words, it is so arranged that, by the discharge adjusting damper 163, the chamber room 11 is kept inside thereof to a slightly positive pressure relative to the atmospheric pressure. According to this arrangement, even if there is a possibility of leakage of the inert gas out of the chamber room 11, the outside air is prevented from penetrating into the chamber room 11. Near the downstream side of the gas damper unit 141 and near the upstream side of the discharge damper unit 162, there are respectively disposed a gas flow velocity monitors 188$a$, 188$b$. By the change in the wind force difference between these gas flow velocity monitors 188$a$, 188$b$, the mechanical failure of the fan 158 and the leakage of the inert gas can be confirmed.

The chamber room 11 has inside thereof a temperature controller (thermometer) 189. This thermometer 189 is connected to the heater 157 through a relay 190. The cooler 156 of the temperature conditioning apparatus is constantly operated at a rated operation and is controlled so that the temperature inside the chamber room 11 is kept to 20° C.±0.5° C.

In the operation to expel (or drive out) the inert gas inside the chamber room 11 to replace it with the outside air, the gas damper unit 141 is closed, and the outside air damper unit 173 and the discharge damper unit 162 are opened. The outside air is thus forcibly introduced by the fan 158 into the chamber room 11. In other words, the outside air is forcibly sent into the chamber room 11 to thereby expel the inert gas inside the chamber room 11. Further, both the discharge valves 167, 167 are opened so as to discharge the inert gas that has leaked into the clearance between both the inner and outer panel units 121, 122.

In the operation to replace the inert gas inside the chamber room 11 with the outside air on condition that the maintenance of the imaging apparatus 2 (opening of the detachable panel units 113, 114) is carried out, the heater 157 is switched off and the outside air adjusting damper 175 and the gas exhaust adjusting damper 163 are fully opened, and the flow adjustment is not carried out. According to this arrangement, the atmosphere inside the chamber room 11 can be replaced with the outside air at a minimum time. Based on the measurement of an oxygen meter (high concentration) 191 provided inside the chamber room 11, the completion of the replacement of the inert gas with the outside air can be confirmed, and the locked state of the electromagnetic locking devices 129 is released. As a result, both the front and rear detachable panel units 113, 114 become a state in which they can be opened.

In the operation to replace the inert gas inside the chamber room 11 with the outside air on condition that the test running of the imaging apparatus 2 (liquid droplet ejection apparatus 6) is carried out to confirm the accuracy of the imaging apparatus 2, the heater 157 is switched on, and the outside air adjusting damper 175 and the gas exhaust adjusting damper 163 are subjected to flow adjustments, whereby the atmosphere inside the chamber room 11 is replaced with outside air of a desired temperature (20° C.±0.5° C.).

In this manner, since the imaging apparatus 2 is contained inside the chamber room 2 and the liquid droplet ejection work by the liquid droplet ejection apparatus 6 is carried out in the atmosphere of a fresh inert gas, the function liquid droplet (light emitting material) that has adhered to the substrate W does not change in quality or is not damaged. The organic EL device can thus be stably manufactured. In addition, in case of replacing the inert gas with the outside air, since the outside air is forcibly sent into the chamber room 11 by using the fan 158, the replacing with the outside air can be attained at a short period of time, and the remaining inert gas can be prevented to the extent possible.

A description will now be made about the method of manufacturing the organic EL device using the above-described electro-optic apparatus 1.

FIGS. 14 through 26 show the process of manufacturing an organic EL device, and also show the structure of the organic EL device. This process is made up of the following steps: i.e., a step of forming a bank portion; a step of plasma processing; a step of forming light emitting element which in turn is made up of a step of forming a hole injection/transport layer, and a step of forming a light emitting layer; a step of forming opposed (or opposite) electrodes; and a step of sealing.

In the step of forming the bank portion, a bank layer 512$a$ made of an inorganic matter (hereinafter called an inorganic-matter bank layer) and a bank layer 512$b$ made of an organic matter (also called an organic-matter bank layer) are laminated in a predetermined position on a circuit element portion 502 and an electrode 511 (also referred to as a pixel electrode) which are formed in advance on a substrate 501.

As described, the step of forming a bank portion includes a step of forming the inorganic-matter bank layer 512a on a part of the electrode 511 as well as the organic-matter bank layer 512b on the inorganic-matter bank layer.

Figure 14:
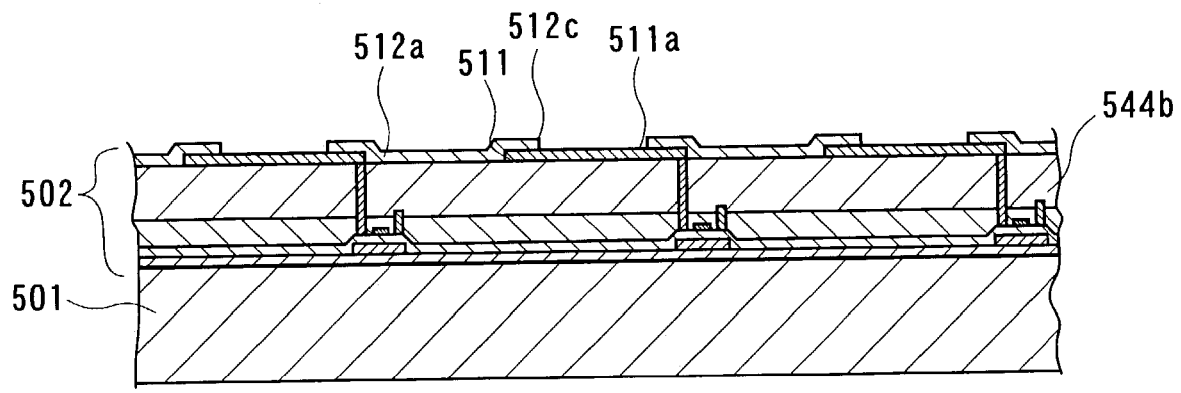
FIG. 14 is a sectional view showing the step of forming a bank portion (inorganic bank) in the method of manufacturing an organic EL device according to this invention.

First, in the step of forming the inorganic-matter bank layer 512a, as shown in FIG. 14, the inorganic-matter bank layer 512a is formed on an interlayer dielectric 544b and on the pixel electrode 511 on the circuit element portion 502. This inorganic-matter bank layer 512a is formed by, e.g., a chemical vapor deposition (CVD) method, a coating method, a sputtering method, vapor deposition method, or the like, on an entire surface of the interlayer dielectric 544b and the pixel electrode 511, thereby forming a film of an inorganic matter such as $SiO_2$, $TiO_2$, or the like.

Thereafter, this inorganic-matter film is subjected to patterning by etching, or the like, to thereby form a lower opening 512c which corresponds to the position of forming an electrode surface 511a of the electrode 511. At this time, it is necessary to form the inorganic-matter bank layer 512a so as to overlap with the peripheral portion of the electrode 511. By thus forming the peripheral portion (only partly) of the electrode 511 in a manner to overlap with the inorganic-matter bank layer 512a, the light emitting region of the light emitting layer 510 can be controlled.

Figure 15:
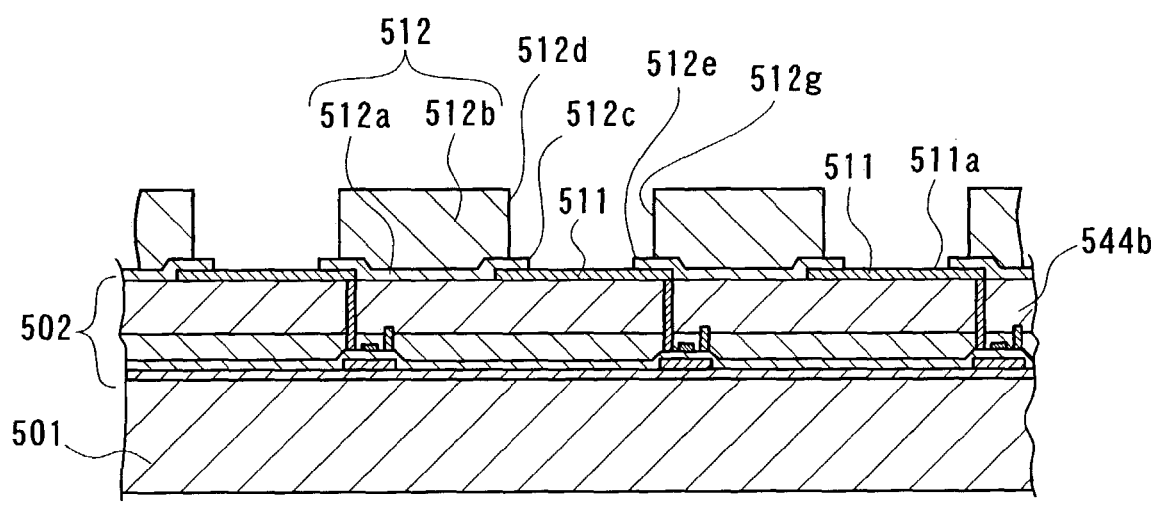
FIG. 15 is a sectional view showing the step of forming a bank portion (organic bank) in the method of manufacturing an organic EL device according to this invention.

Then, in the step of forming the organic-matter bank layer 512b, as shown in FIG. 15, an organic-matter bank layer 512b is formed on the inorganic-matter bank layer 512a. The organic-matter bank layer 512b is etched by the art of lithography, or the like, to thereby form an upper opening 512d of the organic-matter bank layer 512b. The upper opening 512d is formed in a position which corresponds to the electrode surface 511a.

As shown in FIG. 15, the upper opening portion 512d shall preferably be formed larger than the lower opening portion 512c and smaller than the electrode surface 511a. According to this arrangement, the first laminated layer portion 512e enclosing or surrounding the lower opening portion 512c of the inorganic-matter bank layer 512a is arranged to extend toward the center of the electrode 511 beyond the organic-matter bank layer 512b. By thus bringing the upper opening portion 512d and the lower opening portion 512c into communication with each other, there is formed an opening 512g which passes or penetrates through the inorganic-matter bank layer 512a and the organic-matter bank layer 512.

In the subsequent plasma processing step, there are formed a region having ink affinity and a region having ink repellency on the surface of the bank portion 512 and on the surface of the pixel electrode 511a. This plasma processing step is largely classified into: a preliminary heating step; a step of causing to have an affinity with ink (an ink-affinity step) in which an upper surface 512f of the bank portion 512, a wall surface of the opening portion 512g, and an electrode surface 511a of the pixel electrode 511 are made to have ink-affinity; a step of causing to have a repellency against ink (an ink-repellency step) in which an upper surface 512f of the organic-matter bank layer 512a and a wall surface of the upper opening portion 512d are made to have ink repellency; and a cooling step.

First, in the preliminary heating step, the substrate 501 inclusive of the bank portion 512 is heated to a predetermined temperature. In heating the substrate 501, a heater is attached to a stage on which the substrate 501 is mounted and the substrate 501 is heated by this heater together with the stage. In concrete, it is preferable to make the preliminary heating temperature to the range of, e.g., 70–80° C.

Figure 16:
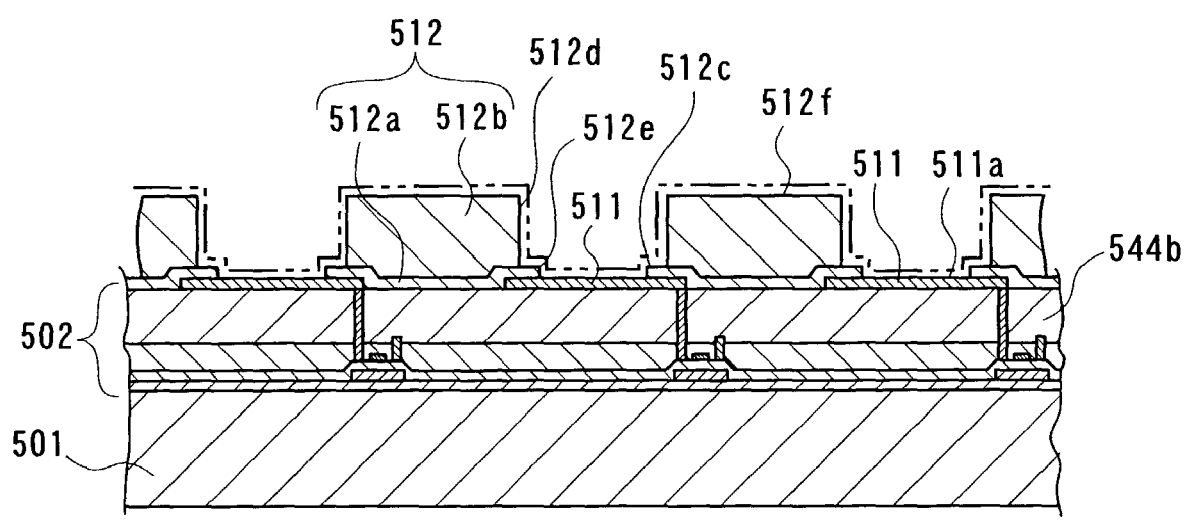
FIG. 16 is a sectional view showing the step of plasma processing (water-affinity processing) in the method of manufacturing an organic EL device according to this invention.

Then, in the ink-affinity step, plasma processing ($O_2$ plasma processing) is carried out in the atmosphere with oxygen as a processing gas. As a result of this $O_2$ plasma processing, ink-affinity processing is carried out, as shown in FIG. 16, on the electrode surface 512e of the pixel electrode 511, and the wall surface and upper surfaces of the first laminated layer portion 512e of the inorganic-matter bank layer 512a and of the upper opening portion 512d of the organic-matter bank layer 512b. As a result of this ink-affinity processing, hydroxyl group is introduced into each of these surfaces to thereby give them ink-affinity properties. In FIG. 16, those portions which are subjected to ink-affinity processing are shown by one-dot line.

Figure 17:
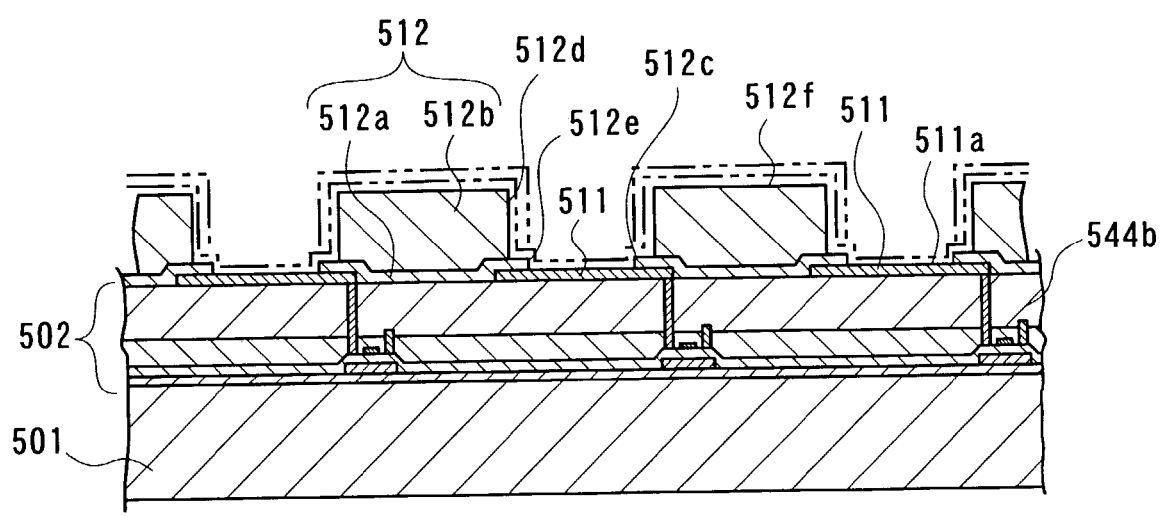
FIG. 17 is a sectional view showing the step of plasma processing (water-repellency processing) in the method of manufacturing an organic EL device according to this invention.

In the subsequent ink-repellency processing step, plasma processing is carried out in the atmosphere with methane tetrafluoride ($CF_4$) as the processing gas ($CF_4$ plasma processing). As a result of $CF_4$ plasma processing, as shown in FIG. 17, the wall surface 512d of the upper opening and the upper surface of the organic-matter bank layer are subjected to ink-repellency processing. As a result of this ink-repellency processing, fluorine group is introduced into each of the surfaces to thereby give them ink-repellency properties. In FIG. 17, the regions showing the ink-repellency properties are shown in two-dot line.

In the subsequent cooling step, the substrate 501 heated by the plasma processing is cooled down to room temperature or to the control temperature for the ink jet step (liquid droplet ejecting step). By thus cooling the substrate 501 that was subjected to plasma processing down to the room temperature or to the predetermined temperature (e.g., to the control temperature at which the ink jet step is carried out), the subsequent hole injection/transport layer forming step can be carried out at a constant temperature.

Then, in the light emitting element forming step, the hole injection/transport layer and a light emitting layer are formed on the pixel electrode 511, thereby forming a light emitting layer. The light emitting element forming step is made up of the following four steps: i.e., a first liquid droplet ejection step in which a first composition of matter for forming the hole injection/transport layer is ejected onto each of the pixel electrodes; a hole injection/transport layer forming step in which the ejected first composition of matter is dried to thereby form the hole injection/transport layer on the pixel electrodes; a second liquid droplet ejection step in which a second composition of matter for forming the light emitting layer is ejected onto the hole injection/transport layer; and a light emitting layer forming step in which the ejected second composition of matter is dried to thereby form a light emitting layer on the hole injection/transport layer.

First, in the first liquid droplet ejection step, the first composition of matter inclusive of the material for forming the hole injection/transport layer is ejected onto the electrode surface 511a by ink jet method (liquid droplet ejection method). This first liquid droplet ejection step and the subsequent steps shall preferably be carried out in an atmosphere of an inert gas such as argon gas, or the like. In case the hole injection/transport layer is formed only on the pixel electrode, the hole injection/transport layer to be formed adjacent to the organic-matter bank layer is not formed.

Figure 18:
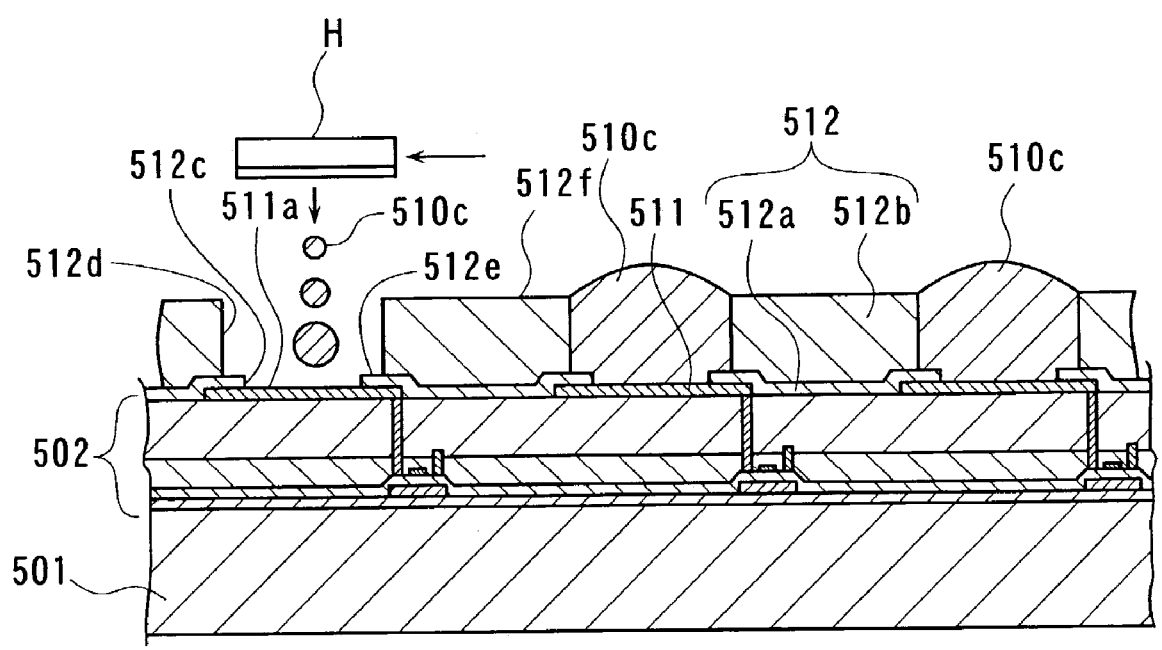
FIG. 18 is a sectional view showing the step of forming a hole injection layer (liquid droplet ejection) in the method of manufacturing an organic EL device according to this invention.

As shown in FIG. 18, the first composition of matter inclusive of the material for the hole injection/transport layer is filled into an ink jet head (a function liquid droplet ejection head) H. An ejection head of the ink jet head H is caused to face the pixel electrode surface 511a which is positioned inside the lower opening portion 512c. While moving the ink heat head H and the substrate 501 relative to each other, the first composition of matter 510c whose amount of liquid per a droplet is ejected from the ejection nozzle toward the electrode surface 511a.

As the first composition of matter to be used here, there may be employed a composition formed by dissolving a mixture of a polythiophene derivative, such as poly(ethylenedioxy)tiophene (PEDOT), and poly(tyrene sulphonicacid)(PSS), or the like, in a polar solvent. As the polar solvent, there may be mentioned glycol ethers, such as isopropyl alcohol (IPA), normal butanol, γ-butyrolactone, N-methyl-pyrrolidone (NMP), 1,3 dimethyl-2-imidazolidinone (DMI) and derivatives thereof, carbitol acetate, and butylcarbitol acetate. It should be noted that as? the hole injection/transport layer-forming material, there may be used the same material for each of the light emitting layers 510b of red (R), green (G), and blue (B), and also there may be used different materials for the respective light emitting layers.

As shown in FIG. 18, the ejected first composition of matter 510 spreads or extends over the ink-affinity processed electrode surface 511a and over the first laminated layer portion 512e and is filled into the lower and upper opening portions 512c, 512d. The amount of the first composition of matter to be ejected onto the electrode surface 511a is determined by the thickness of the hole injection/transport layer, the concentration of the material for forming the hole injection/transport layer, or the like. The first composition of matter 510c may be ejected toward the electrode surface 511a not only in one time but also in several time.

Figure 19:
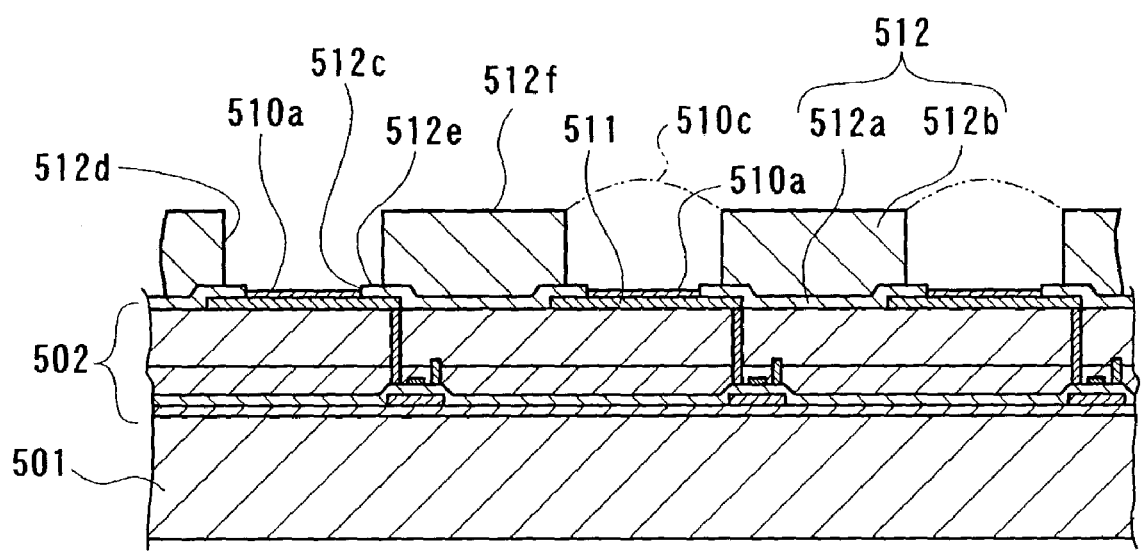
FIG. 19 is a sectional view showing the step of forming a hole injection layer (drying) in the method of manufacturing an organic EL device according to this invention.

As shown in FIG. 19, in the hole injection/transport layer forming step, the ejected first composition of matter is subjected to the processing of drying and heat treatment, to thereby evaporate the solar solvent contained in the first composition of matter, to thereby form the hole injection/transport layer 510a. By carrying out the drying processing, the evaporation of the polar solvent contained in the first composition of matter 510c occurs in portions which are close to the inorganic-matter bank layer 512a and the organic-matter bank layer 512b and, consequently, not only is the polar solvent evaporated but also is the hole injection/transport layer forming material condensed and deposited.

As shown in FIG. 19, the evaporation of the polar solvent occurs also on the electrode surface 511a by the drying processing. As a result, a flat portion 510a which is made up of the hole injection/transport layer material is formed on the electrode surface 511a. Since the speed of evaporation of the polar solvent on the electrode surface 511a is approximately uniform, the material to form the hole injection/transport layer 511a is uniformly condensed on the electrode surface 511a, whereby the flat portion 510a of the uniform thickness is formed.

In the subsequent second liquid droplet ejection step, the second composition of matter containing the light emitting layer forming material is ejected by the ink jet method (liquid droplet ejection method). In this second liquid droplet ejection step, non-polar solvent which is insoluble in the hole injection/transport layer 510a is used as a solvent for the second composition of matter in order to prevent the hole injection/transport layer 510a from getting solved again.

On the other hand, since the hole injection/transport layer 510a is low in affinity to the non-polar solvent, the hole injection/transport layer 510b and the light emitting layer 510b cannot possibly be adhered to each other or the light emitting layer 510b cannot possibly be uniformly coated even if the second composition of matter containing the nonpolar solvent is ejected onto the hole injection/transport layer 510a. As a solution, in order to enhance the surface affinity of the hole injection/transport layer 510a, it is preferable to carry out the surface modification step before forming the light emitting layer.

Therefore, description will now be made about the surface modification step. The surface modification step is carried out by coating the hole injection/transport layer 510a with a solvent that is the same as the non-polar solvent in the first composition of matter or with a solvent which is similar thereto, by the ink jet method (liquid droplet ejection head), spin coating method, or dip coating method and, thereafter, drying it.

Figure 20:
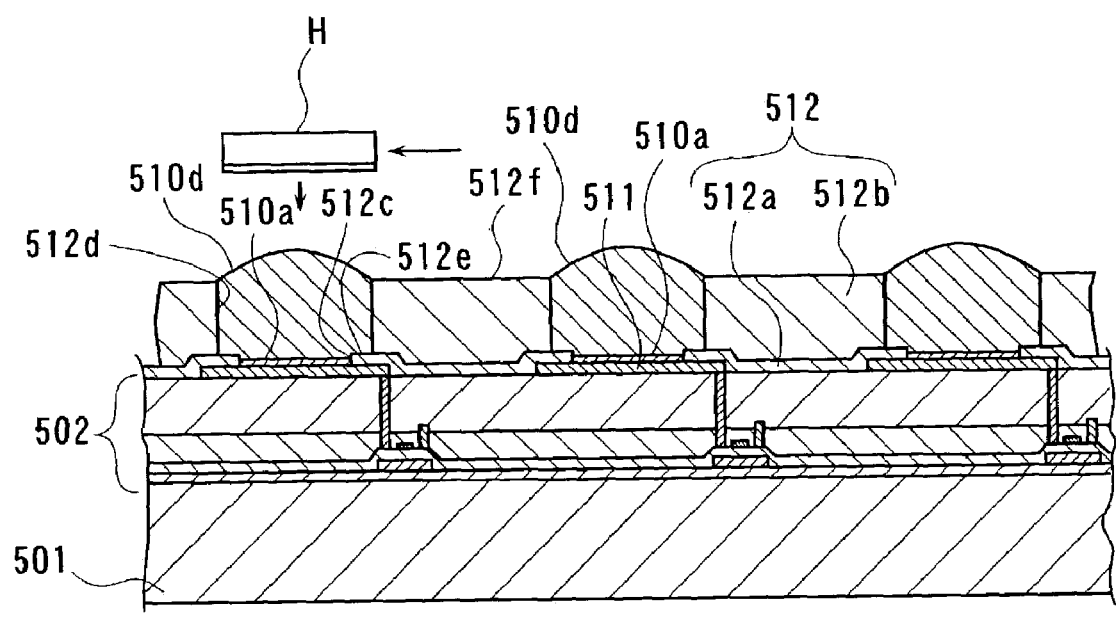
FIG. 20 is a sectional view showing the step of surface modification (droplet ejection) in the method of manufacturing an organic EL device according to this invention.
Figure 21:
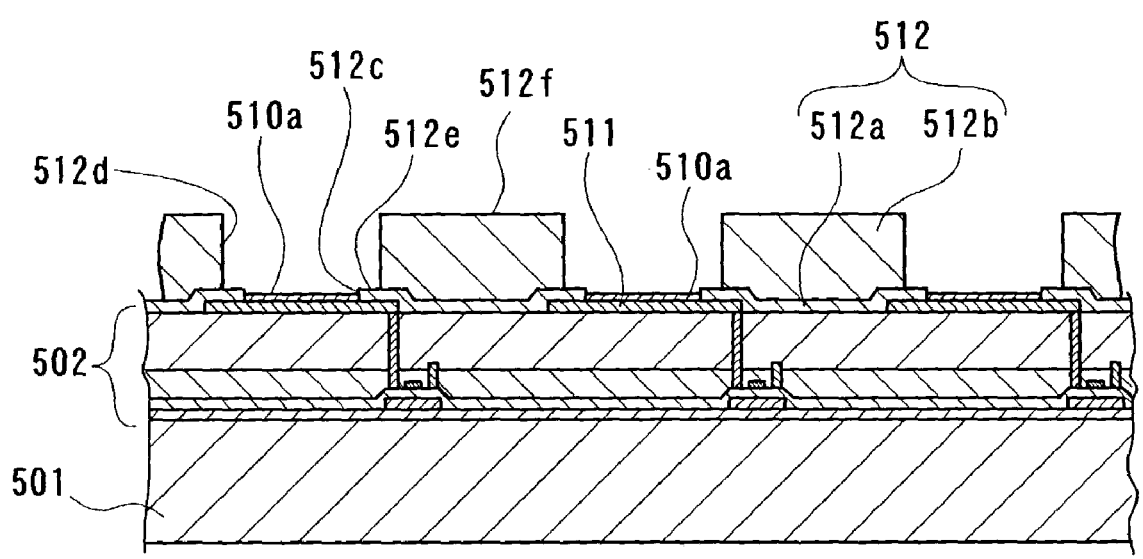
FIG. 21 is a sectional view showing the step of surface modification (drying) in the method of manufacturing an organic EL device according to this invention.

For example, the coating by the ink jet method is carried out in the following manner as shown in FIG. 20. Ink jet head H is filled with a surface modification solvent. The ink jet head H is caused to face the substrate (i.e., the substrate on which the hole injection/transport layer 510a has been formed). While moving the ink jet head H relative to the substrate 501, the surface modification solvent 510d is ejected from the ejection nozzle H. Then, as shown in FIG. 21, the surface modification solvent 510d is dried.

Figure 22:
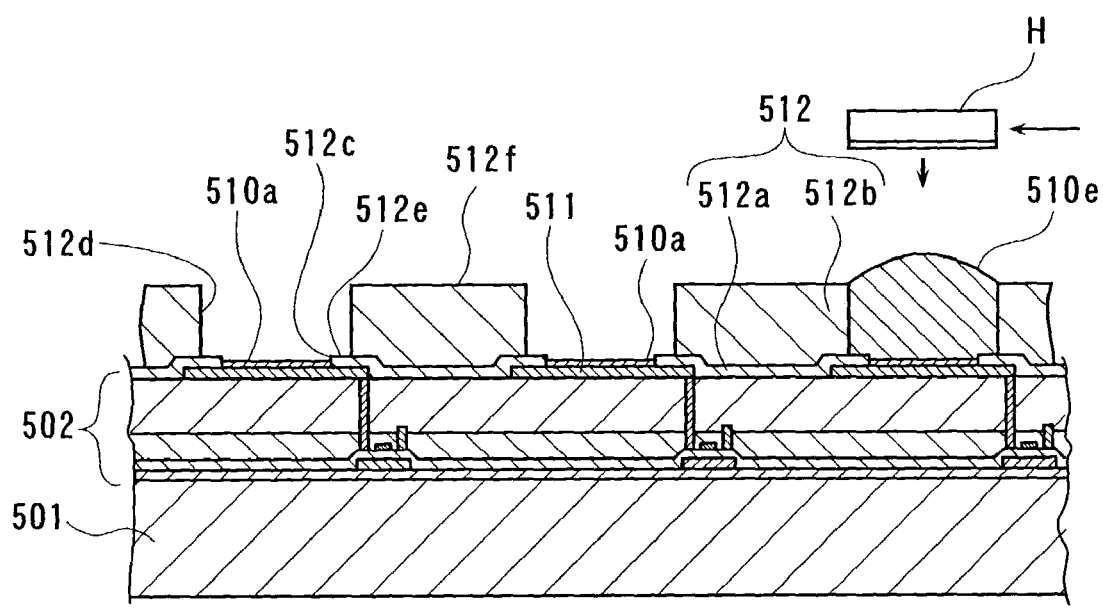
FIG. 22 is a sectional view showing the step of blue color (B) light emitting layer forming in the method of manufacturing an organic EL device according to this invention.

Then, in the second liquid droplet ejection step, the second composition of matter inclusive of the light emitting layer forming material is ejected by the ink jet method (liquid droplet ejection method) onto the hole injection/transport layer 510a. As shown in FIG. 22, the ink jet head H is filled with the second composition of matter containing the blue color (B) light emitting layer forming material. The ejection head of the ink jet head H is caused to face the hole injection/transport layer 510a which is positioned inside the lower and upper openings 512c, 512d. While moving the ink jet head H and the substrate 501 relative to each other, the second composition of matter 510e is ejected from the ejection head as a second composition of matter 510e whose amount of flow per each droplet is kept under control.

As the light emitting layer forming material, there may be used polyfluorene-based high polymer derivatives, (poly) paraphenylene vinylene derivatives, polyphenylene derivatives, polyvinylcarbazole, polythiophene derivatives, perylene-based dyes, coumarin-based dyes, and rhodamine-based dyes. Alternatively, it is possible to use one formed by doping any of the above-described high polymers with an organic EL element. For example, it is possible to use one doped with rubrene, peryene, 9,10-diophenylanthracene, tetraphenylbutadiene, Nile red, Coumarin-6, quinacridon, or the like.

As the non-polar solvent, solvents insoluble to the hole injection/transport layer 510a are preferable, and there may be used, e.g., cyclohexyl benzen, dihydrobenzofuran, trimethylbenzene, tetramethlbenzened, etc. By using such a non-polar solvent for the second composition of the light emitting layers 510b, it is possible to apply the second composition without dissolving the hole injection/transport layer 510a again.

As shown in FIG. 22, the ejected second composition of matter 510e is spread or extended over the hole injection/transport layer 510a and is filled into the lower and upper opening portions 512c, 512d. The second composition of matter may be ejected onto the hole injection/transport layer 510a not only one time but also several times. In this case, the quantity of the second composition of matter in each time of ejection may be the same or may be changed from time to time.

Figure 23:
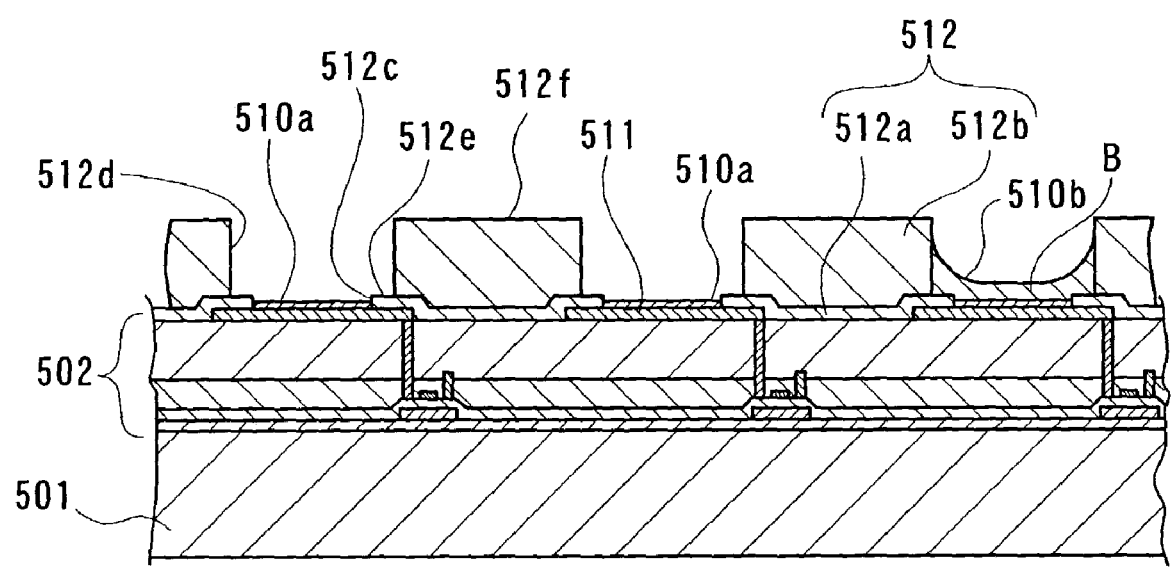
FIG. 23 is a sectional view showing the step of blue color (B) light emitting layer forming (drying) in the method of manufacturing an organic EL device according to this invention.

Then, in the light emitting layer forming step, drying processing and heat treating processing are carried out after the second composition of matter has been ejected. In the drying processing, the ejected second composition of matter is subjected to drying processing to thereby evaporate the non-polar solvent contained in the second composition of matter. A blue color (B) light emitting layer 510b is thus formed as shown in FIG. 23.

Figure 24:
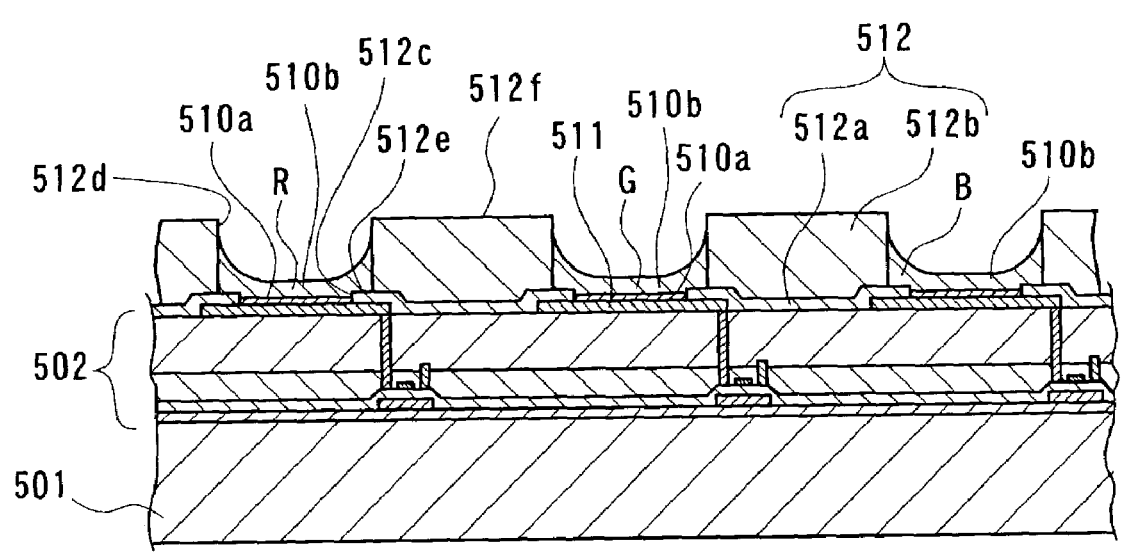
FIG. 24 is a sectional view showing the step of red color (R), green color (G), and blue color (B) light emitting layer forming in the method of manufacturing an organic EL device according to this invention.

As shown in FIG. 24, a red color (R) light emitting layer 510b is formed in the same way as in the case of the blue color (B) light emitting layer 510b. Finally, a green color (G) light emitting layer is formed. It is to be noted that the order of forming the light emitting layers 510b is not limited to the above-described order, but may be arbitrarily determined. For example, it is possible to determine the order of forming the light emitting layers depending on the light emitting layer materials.

Figure 25:
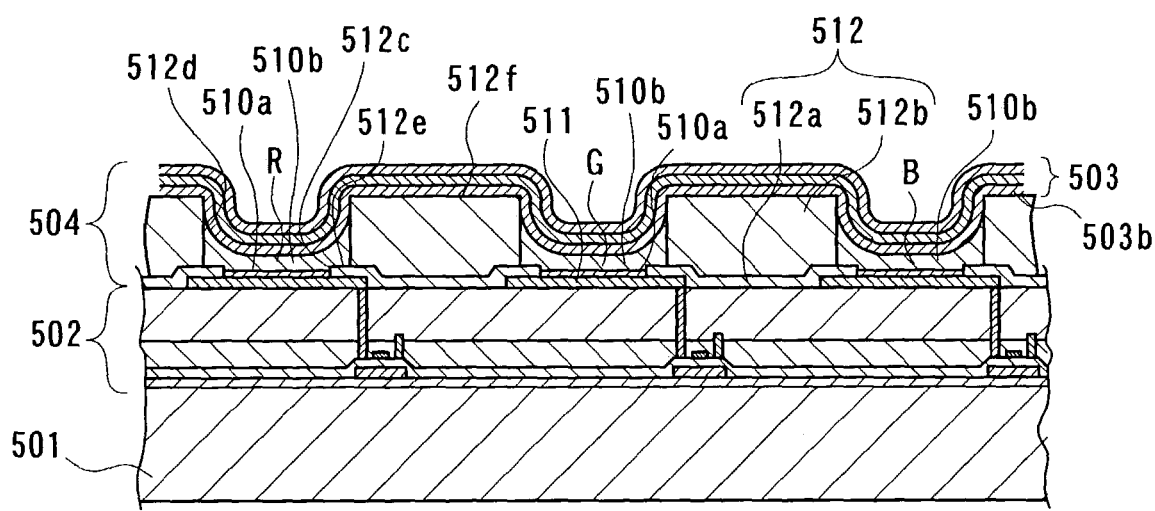
FIG. 25 is a sectional view showing the step of forming opposed (opposite) electrode in the method of manufacturing an organic EL device according to this invention.

Thereafter, in the opposite electrode forming step, a cathode electrode 503 (an opposite electrode) is formed on the entire surface of the luminous layer 510b and the organic-matter bank layer 512b as shown in FIG. 25. This cathode electrode 503 may be formed by laminating a plurality of materials. For example, on the side close to the luminous layer, it is preferable to form a material with a small work function. For example, it is possible to use Ca, Ba, or the like. Depending on the material, on some cases, it is better to thinly form LiF, or the like, in a lower layer. It is further preferable to use on the upper side (sealing side) a material with a higher work function than that on the lower layer. These cathodes (cathode layers) 503 are preferably be formed by vapor deposition method, sputtering method, chemical vapor deposition (CVD) method, or the like. Particularly, it is preferable to resort to the vapor deposition method in order to prevent the luminous layer 510b from being damaged by the heat.

Lithium fluoride may be formed only on the light emitting layers 510b, and only on the blue color (B) light emitting layer 510b. In this case, the other red color (R) light emitting layer and green color (G) light emitting layer 510b, 510b will contact the upper cathode layer 503 made of LiF. In addition, on an upper portion of the cathode layer 12, it is preferable to use Al film, Ag film, or the like, which is formed by vapor deposition method, sputtering method, CVD method, or the like. Further, on top of the cathode 503, a protection layer such as of $Si_2$, SiN, or the like, may be provided for the purpose of prevention of oxidation.

Figure 26:
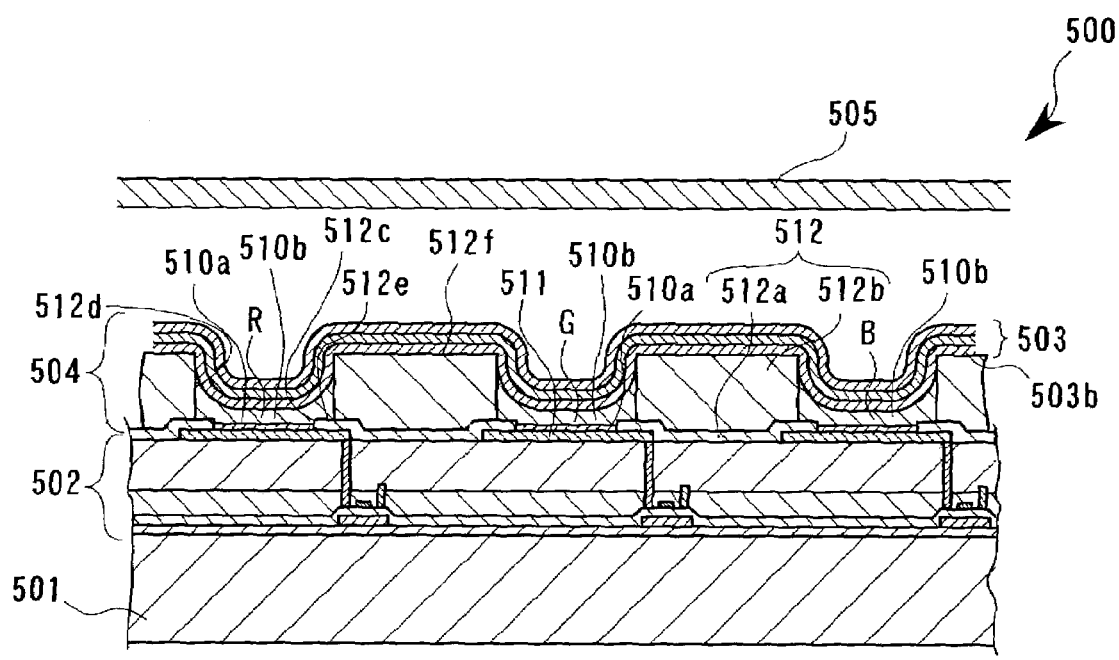
FIG. 26 is a sectional view showing the step of sealing in the method of manufacturing an organic EL device according to this invention.

In the sealing step as shown in FIG. 26, a sealing substrate 505 is laminated on top of the organic EL element 504 in an atmosphere of the inert gas such as of nitrogen, argon, helium, or the like. The sealing step is preferably carried out in the atmosphere of the inert gas of nitrogen, argon, helium, or the like. If the sealing step is carried out in the atmosphere of outside air, there is a possibility of penetration of water, oxygen, or the like, into the defect portions if defects such as a pin hole, or the like, are present in the cathode 503. The cathode 503 is thus oxidized, which is not preferable. Finally, the cathode 503 is connected to the wiring of the flexible substrate and the wiring of the driving integrated circuit (IC) circuit element portion 502 is connected, whereby the organic EL device 500 according to this embodiment is obtained.

As described hereinabove, according to the method of replacing the atmosphere of the inert gas with the outside air according to this invention, the outside air is forcibly sent into the chamber room. Therefore, it is possible to efficiently replace the atmosphere of the inert gas inside the chamber room with the outside air in a short time.

In addition, according to the electro-optic apparatus and the organic EL device according to this invention, the workpiece processing can be carried out in a good atmosphere of the inert gas. In addition, the maintenance work, or the like, of the workpiece processing apparatus can be carried out in a safe atmosphere of the outside air. The replacement of the inert gas with the outside air can be carried out in a short time. Further, the EL device of high quality and reliability can be provided at a low cost.

What is claimed is:

1. A chamber apparatus for housing a workpiece processing apparatus, comprising:
    a chamber room for housing the workpiece processing apparatus;
    a gas supply passage for supplying an inert gas into said chamber room, said gas supply passage having interposed therein a gas damper;
    a discharge passage for discharging the atmosphere inside said chamber room, said discharge passage having interposed therein a discharge damper; and
    a fan for forcibly sending outside air into said chamber room.

2. The chamber apparatus according to claim 1, further comprising an outside air introduction passage which forms a confluence portion with said gas supply passage on a downstream side of said gas damper and which has interposed therein an outside air damper, wherein said fan is interposed in said gas supply passage on a downstream side of said confluence portion of said outside air introduction passage.

3. The chamber apparatus according to claim 2, further comprising a temperature adjusting apparatus which is interposed in said gas supply passage between said confluence portion of said outside air introduction passage and said fan.

4. The chamber apparatus according to claim 2, further comprising a filter which is interposed in said gas supply passage on a downstream side of said fan.

5. The chamber apparatus according to claim 2, wherein said outside air damper comprises two gate dampers.

6. The chamber apparatus according to claim 2, wherein said chamber room is provided with a detachable panel body for maintenance purpose, and wherein said detachable panel is made up of an outer panel and an inner panel which face each other with a clearance therebetween.

7. The chamber apparatus according to claim 6, further comprising:
    a panel body discharge passage one end portion of which is communicated with said clearance between both said inner and outer panels and an opposite end portion of which is communicated with said discharge passage on an upstream side of said discharge damper; and
    a panel body discharge damper which is interposed in said panel body discharge passage.

8. The chamber apparatus according to claim 6, further comprising:
    an electromagnetic lock mechanism which locks to close said detachable panel body; and
    an oxygen concentration measuring means for measuring an oxygen concentration inside said chamber room, wherein said electromagnetic lock mechanism locks and unlocks said detachable panel body depending on a result of measurement by said oxygen concentration measuring means.

9. The chamber apparatus according to claim 2, further comprising a control means which controls to open and close said gas damper, said discharge damper and said outside air damper,
    wherein said control means: controls said gas damper and said discharge damper so as to be opened and said outside air damper so as to be closed at a time of operation with the inert gas; and controls said gas damper so as to be closed and said discharge damper and said outside air damper so as to be opened at a time of introduction of outside air.

10. The chamber apparatus according to claim 2, further comprising a machine room adjacent to said chamber room, wherein said gas supply passage and said outside air introduction passage are constituted by partitioning said machine room by a partition wall.

11. The chamber apparatus according to claim 10, wherein at least said gas supply passage extends in an up and down direction.

12. An electro-optic apparatus, comprising said chamber apparatus according to claim 1, and said workpiece processing apparatus which is housed inside said chamber apparatus.

13. The electro-optic apparatus according to claim 12, wherein said workpiece processing apparatus is an apparatus for manufacturing an organic EL device.

14. The electro-optic apparatus according to claim 13, wherein said apparatus for manufacturing an organic EL device comprises a liquid droplet ejection apparatus which: carries out relative scanning between a function liquid droplet ejection head having introduced thereinto a light emitting function material and the workpiece in a form of a substrate; and selectively ejects the light emitting function material to thereby form an organic EL function layer in a multiplicity of pixel regions on the substrate.

15. The electro-optic apparatus according to claim 14, wherein said organic EL function layer is at least an EL light emitting layer out of the EL light emitting layer and a hole injection layer.

16. An organic EL device manufactured by the electro-optic apparatus as set forth in claim 13.

* * * * *